(12) United States Patent
Fujiwara et al.

(10) Patent No.: US 8,089,317 B2
(45) Date of Patent: Jan. 3, 2012

(54) PHASE-LOCKED LOOP CIRCUIT, RECORDING-AND-REPRODUCING APPARATUS, AND ELECTRONIC APPARATUS

(75) Inventors: Tetsuya Fujiwara, Kanagawa (JP); Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 12/458,706

(22) Filed: Jul. 21, 2009

(65) Prior Publication Data
US 2010/0026406 A1    Feb. 4, 2010

(30) Foreign Application Priority Data
Jul. 31, 2008   (JP) ................. 2008-197475

(51) Int. Cl.
*H03L 7/00* (2006.01)
(52) U.S. Cl. ............ 331/16; 331/10; 331/11; 331/17; 331/25; 331/44
(58) Field of Classification Search ......... 331/10, 331/11, 14, 16, 17, 25, 44; 327/156, 157
See application file for complete search history.

(56) References Cited

U.S. PATENT DOCUMENTS

| | | | | |
|---|---|---|---|---|
| 6,992,536 | B2* | 1/2006 | Kiyose et al. | 331/177 R |
| 7,146,143 | B2* | 12/2006 | Oosawa et al. | 455/245.1 |
| 7,323,944 | B2* | 1/2008 | Florescu et al. | 331/14 |
| 2005/0180287 | A1 | 8/2005 | Lee et al. | |
| 2006/0139106 | A1* | 6/2006 | Dosho et al. | 331/16 |
| 2007/0273415 | A1* | 11/2007 | Kimura et al. | 327/157 |
| 2008/0061889 | A1* | 3/2008 | Matsumoto et al. | 331/11 |
| 2010/0026405 | A1* | 2/2010 | Ueno et al. | 331/36 C |

FOREIGN PATENT DOCUMENTS

| | | |
|---|---|---|
| JP | 02-017726 A | 1/1990 |
| JP | 06-152567 A | 5/1994 |
| JP | 06-350355 A | 12/1994 |
| JP | 08-063892 A | 3/1996 |
| JP | 09-153795 A | 6/1997 |
| JP | 09-312565 A | 12/1997 |

(Continued)

OTHER PUBLICATIONS

Japanese Office Action issued Jan. 11, 2011 for corresponding Japanese Application No. 2008-197475.

(Continued)

*Primary Examiner* — Joseph Chang
*Assistant Examiner* — Jeffrey Shin
(74) *Attorney, Agent, or Firm* — Rader, Fishman & Grauer PLLC

(57) ABSTRACT

A phase-locked loop circuit includes a phase detection unit, a loop filter unit including a series circuit of a resistor and a capacitor, first and second pulse-current output units which supply differential and single-end pulse currents corresponding to phase information to the resistor and capacitor, an oscillating unit which varies an oscillation frequency in accordance with a voltage generated at the resistor and capacitor, and a calibration unit which obtains information of an oscillation gain in actual operation and corrects an operation of the oscillating unit on the basis of a difference between the oscillation gain in actual operation and a target oscillation gain. The oscillation gain in actual operation represents a characteristic of oscillation frequency versus input signal of the oscillating unit and is obtained using predetermined oscillation control signals on the basis of a difference between actual oscillation frequencies under the oscillation control signals.

1 Claim, 20 Drawing Sheets

FOREIGN PATENT DOCUMENTS

| | | |
|---|---|---|
| JP | 10-084279 | 3/1998 |
| JP | 2001-144610 A | 5/2001 |
| JP | 2002-100984 A | 4/2002 |
| JP | 2002-198808 A | 7/2002 |
| JP | 2007-288737 A | 11/2007 |
| JP | 2008-072166 A | 3/2008 |
| JP | 2008-124687 A | 5/2008 |

OTHER PUBLICATIONS

Office Action from U.S. Patent and Trademark Office for U.S. Appl. No. 12/458,726 dated Apr. 1, 2011.

* cited by examiner

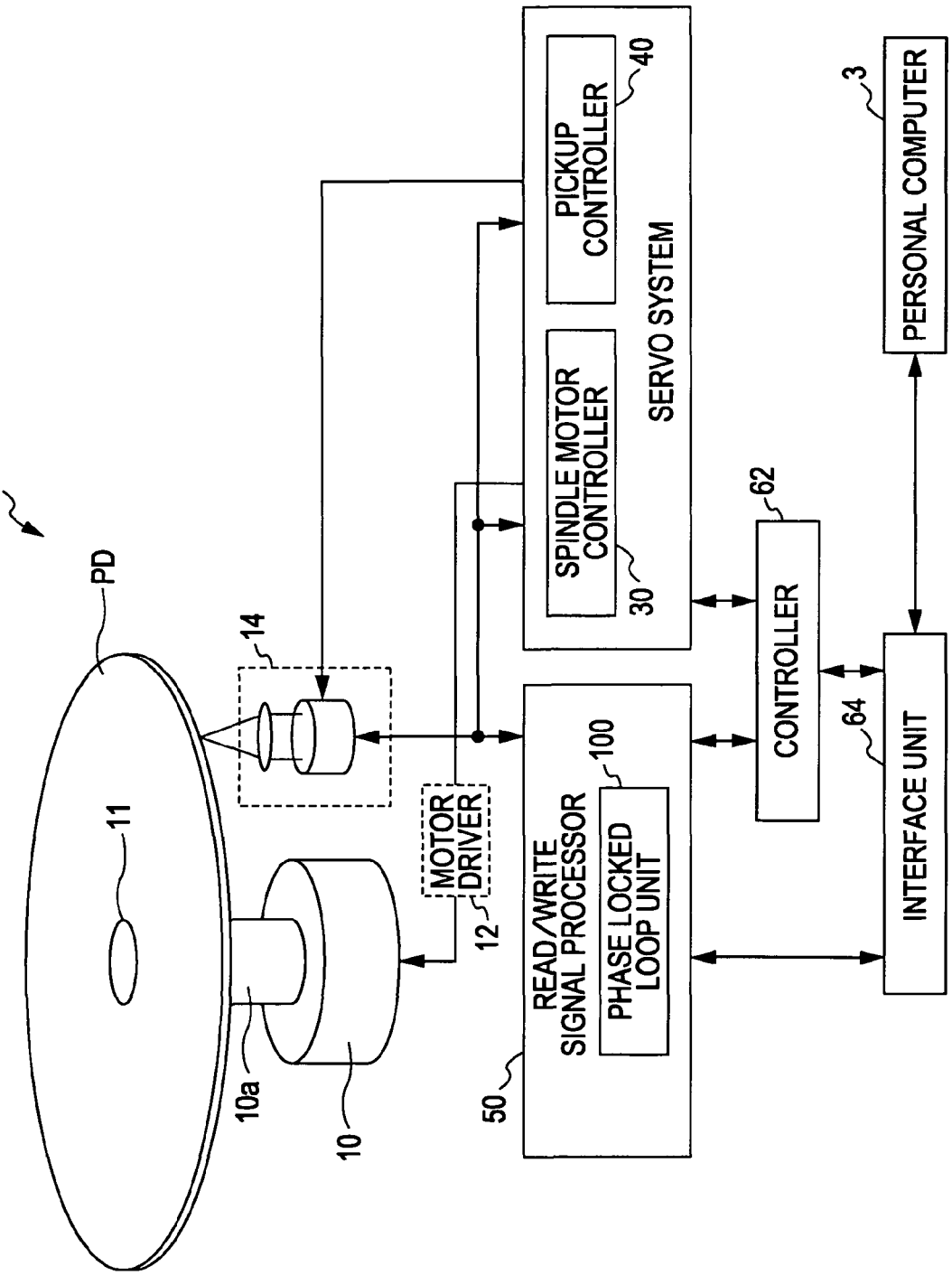

240_1

240_2

Nch CURRENT SOURCE GmBank

Pch CURRENT SOURCE GmBank

FIG. 10B
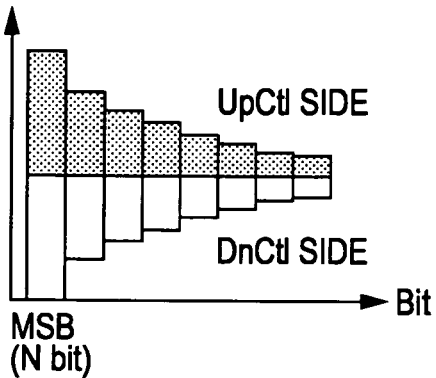
FIG. 10C   1ST STEP
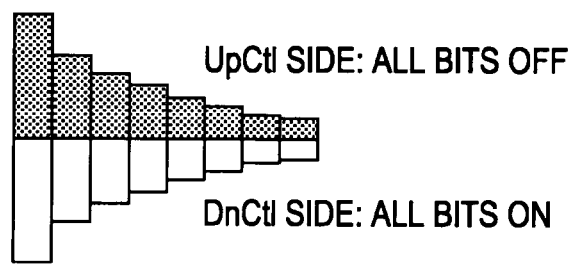
2ND STEP
FIG. 10D
$\Delta Ec > \Delta Et$
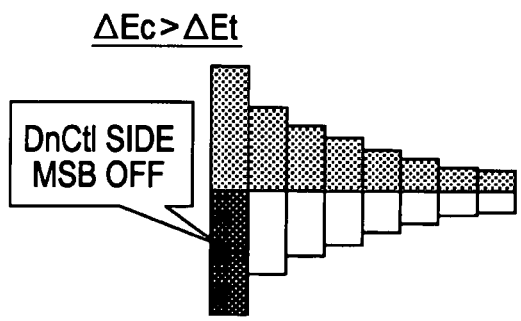
FIG. 10E
$\Delta Ec \leq \Delta Et$
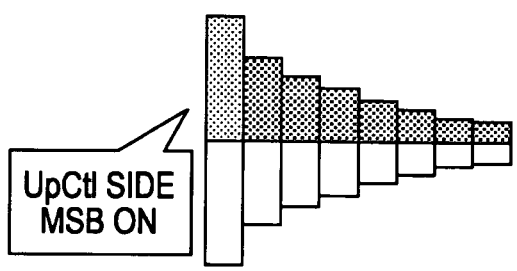

PHASE-LOCKED LOOP CIRCUIT, RECORDING-AND-REPRODUCING APPARATUS, AND ELECTRONIC APPARATUS

BACKGROUND OF THE INVENTION

1. Field of the Invention

The present invention relates to a phase-locked loop (PLL) circuit used in various types of electronic apparatuses, for example, in communication apparatuses, such as a television receiver and a mobile phone, for receiving or transmitting information, or in read/write apparatuses, such as an optical disk apparatus. The present invention also relates to an electronic apparatus, such as a read/write apparatus, including the phase-locked loop (PLL) circuit.

2. Description of the Related Art

In general, phase-locked loop (PLL) circuits are installed in various types of electronic apparatuses, such as a communication apparatus, a transmitting-and-receiving apparatus, and an optical disk apparatus, for producing an oscillation signal with high spectrum precision or for generating a frequency-locked and phase-locked clock signal for a data signal. Examples of apparatuses including the PLL circuits include a wireless communication apparatus, such as a mobile phone, a serial communication system using various cables, and a digital data recovery system (read channel) for recovery digital data written on a disk medium.

FIG. 11A is a circuit block diagram of a common phase-locked loop circuit 100Z. As shown in FIG. 11A, the phase-locked loop circuit 100Z includes an oscillating unit 101 provided with a frequency divider 102. The oscillating unit 101 generates an output oscillation signal Vout with an oscillation frequency fosci on the basis of an oscillation control signal CN (oscillation control current Icnt in this example). The frequency divider 102 divides the oscillation frequency fosci of the output oscillation signal Vout into $1/\alpha$ to generate a frequency-divided oscillation signal Vout1. In this example, the oscillating unit 101 includes a current controlled oscillator (CCO) circuit 101B. However, the oscillating unit 101 may also include a voltage controlled oscillator (VCO) circuit.

The phase-locked loop circuit 100Z also includes a phase comparator 103, a current-output loop-filter driver 104 including a charge pump circuit, and a loop filter unit 106. The phase comparator 103 compares an input signal Vin with the output oscillation signal Vout from the oscillating unit 101 or the frequency-divided oscillation signal Vout1 from the frequency divider 102, and outputs a comparison result signal Comp which represents a phase difference as a result of the comparison. The phase-locked loop circuit including the loop-filter driver 104 which includes the charge pump circuit will hereinafter be referred to as a charge-pump PLL.

The loop-filter driver 104 receives the comparison result signal Comp from the phase comparator 103 and outputs a pulsed charge-pump current Icp which corresponds to the comparison result signal Comp. The loop filter unit 106 includes at least a capacitor element 164 (loop filter capacitor) with a capacitance C. The loop filter unit 106 generates the oscillation control signal CN for controlling the oscillation frequency fosci of the oscillating unit 101 using a charge voltage Vcp of the capacitor element 164 based on the charge-pump current Icp from the loop-filter driver 104. In this example, the loop filter unit 106 includes a resistor element (loop filter resistor) with a resistance R in addition to the capacitor element 164.

In the phase-locked loop circuit 100Z having the above-described structure, the input signal Vin and the output oscillation signal Vout from the oscillating unit 101 (or the frequency-divided oscillation signal Vout1 from the frequency divider 102) are input to the phase comparator 103, and the phase comparator 103 outputs the comparison result signal Comp which represents a phase error. The oscillating unit 101 is oscillated by means of the charge-pump PLL on the basis of the comparison result signal Comp. Thus, the phase of the output oscillation signal Vout is locked to that of the input signal Vin.

The phase-locked loop circuit preferably has good jitter performance and a short lock time. These factors can be optimized by adequately setting a natural frequency $\omega n$ and a damping factor $\zeta$ of the phase-locked loop circuit to suitable values. A linearized closed-loop transfer function is generally used for the analysis of the charge-pump PLL. The natural frequency $\omega n$ and the damping factor $\zeta$ can be expressed as Equations (1-1) and (1-2) (Expression (1)) given below using a circuit gain of the loop-filter driver 104 (hereinafter referred to as CP circuit gain Kcp), an input-signal/oscillation-frequency conversion gain Kosci of the oscillating unit 101 (i.e., oscillation gain, which is a VCO circuit gain Kvco in Expression (1)), the resistance R of the resistor element, and the capacitance C of the capacitor element 164.

$$\left. \begin{array}{ll} \omega_n = \sqrt{\dfrac{K_{CP}K_{VCO}}{C}} & (1\text{-}1) \\ \zeta = \dfrac{RC}{2}\omega_n & (1\text{-}2) \end{array} \right\} \quad (1)$$

In the case where the phase-locked loop circuit 100Z having the above-described structure is used, if the input signal frequency or the data rate varies, the natural frequency $\omega n$ is preferably varied in accordance with the input frequency while the damping factor $\zeta$ is maintained constant. For example, in a data recovery system for recovery data recorded on a disc medium, the data rate varies by a factor of about 2 between an inner periphery and an outer periphery of the disc. Therefore, the natural frequency $\omega n$ is preferably varied in accordance with the data rate. According to Equation (1-1), the natural frequency $\omega n$ can be varied by controlling the CP circuit gain Kcp, the VCO circuit gain Kvco, and the capacitance C. At the same time, according to Equation (1-2), the damping factor $\zeta$ can be maintained constant by varying the capacitance C and the resistance R.

In the case where the phase-locked loop circuit 100Z is manufactured as an integrated circuit (IC), a chip area for the capacitor element 164 is generally larger than that for the resistor element. Therefore, when the PLL circuit is manufactured as an IC, it is economically disadvantageous to provide many capacitor elements to make the capacitance C variable. If the capacitance C is not variable, the resistance R is the only independent variable for the natural frequency $\omega n$ and the damping factor $\zeta$.

In view of the above situation, the capacitance C may be set constant and a plurality of resistor elements may be provided in a switchable manner so that the resistance R can be set to various values. However, in the structure including a plurality of resistor elements which can be switched by respective switches, in the case where it is necessary to switch a time constant C·R of the loop filter unit 106 in multiple steps, a large number of resistor elements are arranged together with respective switches and are subjected to switching control. Therefore, the number of resistor elements is limited and it is difficult to perform fine adjustment. As a result, it may be difficult to form the phase-locked loop circuit as an IC depending on the use thereof.

Accordingly, there has been a demand for a PLL circuit which can be formed as an IC irrespective of the use thereof. To comply with such a demand, a structure described in, for example, Japanese Unexamined Patent Application Publication No. 10-84279 (hereinafter referred to as Patent Document 1), has been proposed.

FIG. 11B shows a phase-locked loop circuit disclosed in Patent Document 1. In the structure described in Patent Document 1, a loop filter is composed of an integration circuit (only a capacitor element (capacitor 15) is provided in FIG. 1 of Patent Document 1), and a voltage-current conversion circuit (gm amplifier 16) which converts a voltage generated by the integration circuit into a current is provided. A first charge pump (charge pump circuit 13) is provided to drive the integration circuit, and a second charge pump (charge pump circuit 14) is additionally provided. In addition, an adding unit (adder 17) for adding a current from the second charge pump and a current from the voltage-current conversion circuit is also provided. With this structure, a circuit equivalent to a CR loop filter can be formed and a phase-locked loop circuit which can be easily formed as an IC can be obtained.

The natural frequency $\omega n$ and the damping factor $\zeta$ of the phase-locked loop circuit described in Patent Document 1 can be expressed as Equations (2-1) and (2-2) (Expression (2)) given below using a circuit gain (hereinafter referred to as a CPC circuit gain Kcpc) of the first charge pump for driving the integration circuit, a circuit gain (hereinafter referred to as a CPR circuit gain Kcpr) of the second charge pump, and a gain gm of the voltage-current conversion circuit.

$$\left. \begin{array}{l} \omega_n = \sqrt{\dfrac{K_{CPC} g_m K_{CCO}}{C}} \quad (2\text{-}1) \\ \zeta = \dfrac{CK_{CPR}}{2 g_m K_{CPC}} \omega_n \quad (2\text{-}2) \end{array} \right\} \quad (2)$$

As is clear from Expression (2), the natural frequency $\omega n$ and the damping factor $\zeta$ can be varied without changing the capacitance C or the resistance R by varying the circuit gains (CPC circuit gain Kcpc and CPR circuit gain Kcpr) of the two charge pumps and the gain gm of the voltage-current conversion circuit. Thus, the natural frequency $\omega n$ can be varied while, for example, the damping factor $\zeta$ is maintained constant, as described above.

As is clear from the comparison between Expressions (1) and (2), the resistance R in Expression (1) corresponds to (CPR circuit gain Kcpr)/(gm·(CPC circuit gain Kcpc)). These gains can be easily varied.

However, when the phase-locked loop circuit is manufactured as an IC in practice, the parameters which determine the natural frequency $\omega n$ and the damping factor $\zeta$, that is, the parameters such as the charge-pump current, the gain gm, and the input-signal/oscillation-frequency conversion gain Kosci, may differ from the design values. Therefore, it is difficult to set the natural frequency $\omega n$ and the damping factor $\zeta$ to desired values. In addition, the phase-locked loop circuit is generally used in various environments, and the above-mentioned parameters also vary in accordance with the temperature. Therefore, the natural frequency $\omega n$ and the damping factor $\zeta$ may become shifted from the set values.

If the natural frequency $\omega n$ largely differs from the set value thereof, a time for the phase of the output oscillation signal Vout to be locked to that of the input signal Vin, that is, an acquisition time, also differs from the set value. Therefore, it becomes difficult to design the overall system including the phase-locked loop circuit. In addition, if the natural frequency $\omega n$ becomes lower than the desired value, the jitter increases. To avoid such a problem, there has been a demand for a technique to compensate for the manufacturing variations and the temperature characteristics of the input-signal/oscillation-frequency conversion gain Kosci.

To comply with such a demand, structures described in the following documents have been proposed:

Takashi Morie, Shiro Dosho, Kouji Okamoto, Yuji Yamada and Kazuaki Sogawa, "A-90dBc@10 kHz Phase Noise Fractional-N Frequency Synthesizer with Accurate Loop Bandwidth Control Circuit", 2005 Symposium on VLSI Circuits Digest of Technical Papers, pp. 52-55 (hereinafter referred to as Non-Patent Document 1); and Takeo Yasuda, "HIGH-SPEED WIDE-LOCKING RANGE VCO WITH FREQUENCY CALIBRATION", IEEE Int. Symp. On Circuits and Systems, May 28-31, 2000, pp. III45-III48 (hereinafter referred to as Non-Patent Document 2).

FIG. 11C shows the structure according to Non-Patent Document 1. The structure according to Non-Patent Document 1 includes a high-precision bias circuit which is not affected by a temperature variation and which serves to maintain the charge-pump current constant. In addition, a gain control amplifier which adjusts the gain for an oscillation control signal CN is provided on the input side of a voltage controlled oscillator (VCO). The gain of the voltage controlled oscillator (VCO) is measured, and the gain control amplifier is controlled on the basis of a correction value which corresponds to the result of the measurement. Thus, a feedback signal is input to the voltage controlled oscillator (VCO).

In the structure according to Non-Patent Document 1, each gain is calibrated before the operation as a PLL is started. First, to calibrate the gain of the voltage controlled oscillator VCO, reference voltages Vrefs shown in FIG. 11C are supplied to the voltage controlled oscillator VCO to oscillate the voltage controlled oscillator VCO. Two voltages Vrefs, which are 2 V and 1 V, are prepared in this example and an oscillation frequency is determined for each of the voltages by a gain controller GainCnt. The VCO gain is the difference between the oscillation frequencies, and magnitude relationship between the thus-determined VCO gain and a target VCO gain is determined. The result of the determination is fed back to a voltage-current (VI) conversion circuit. The above-described process is repeated N times. Thus, the gain of the VI conversion circuit is digitally changed so as to calibrate the VCO gain. In addition, a current having information regarding a temperature dependency compensation using a dummy filter circuit and a diode is used as a bias current of a charge pump CP1. Thus, variation in $\omega n$ due to the filter and the temperature variation is calibrated.

FIGS. 11D and 11E show the structure according to Non-Patent Document 2. FIG. 11D shows the overall structure, and FIG. 11E shows the structure of a single delay cell of a VCO included in the overall structure. In the structure according to Non-Patent Document 2, a control voltage is clamped between an upper limit and a lower limit by a clamping circuit CLP, and an oscillating frequency range is calibrated within a voltage range between the upper and lower limits. The PLL is caused to lock at upper-limit and lower-limit frequencies using Ref.Clock and frequency dividers "DIVIDE by D" and "DIVIDE by N", and the magnitude relationship between the voltages corresponding to the oscillations at the locked frequencies is determined by a comparator CMP. Then, a switch transistor connected to a current-source transistor shown in FIG. 11E is digitally controlled such that the voltages corresponding to the upper-limit and lower-limit frequencies are within the clamping voltage range. As a result, a desired oscillation frequency can be obtained within a predetermined voltage dynamic range.

SUMMARY OF THE INVENTION

However, in the structure according to Non-Patent Document 1, a high-precision bias circuit which is not affected by a temperature variation is additionally provided to maintain the charge-pump current constant, and a gain control amplifier is also additionally provided to adjust the gain for the oscillation control signal CN before the oscillation control signal CN is input to the voltage controlled oscillator.

In addition, in the structure according to Non-Patent Document 1, the correction circuits also have manufacturing variations. Therefore, the correction circuits are designed such that the gain of the voltage controlled oscillator VCO can be adjusted even when the correction circuits have manufacturing variations. Therefore, it is difficult to design the correction circuits. The absolute value of the gain of the gain control amplifier is controlled on the basis of the measurement result. However, in view of the device characteristics and the circuit structure, it is difficult to compensate for the variations by controlling the absolute value of the gain.

In addition, there is also a problem of noise performance. In the structure shown in FIG. 11C, the calibration information for the VCO gain is fed back to the VI converter. Thus, a noise element other than that of the VCO circuit is included. Therefore, a low-noise design is applied.

In addition, there is also a problem of calibration method. The structure shown in FIG. 11C does not have a function of calibrating a variation in a loop filter resistor. In general, resistances vary about ±20% due to process variation. As is clear from Expression (1), this means that the damping factor $\zeta$ also varies about ±20%. For example, assuming that the capacitance C of the loop filter is varied by −10% and the resistance R is varied by −20%, the calibration information of the capacitance C is fed back to CP1, and the gain of CP1 varies by −10%. Thus, the variation in the damping factor $\zeta$ is increased due to the capacitance calibration.

The structure of Non-Patent Document 2 provides a frequency-range calibration technique, but does not provide gain calibration.

As described above, the structure of Patent Document 1 is advantageous in view of versatility of the natural frequency $\omega n$ and the damping factor $\zeta$. With regard to calibration, although the structure of Non-Patent Document 1 has been proposed, there are still problems regarding the noise performance, the circuit scale, ease of calibration, and design and verification processes. Thus, a phase-locked loop (PLL) circuit which can solve all of the problems has not yet been developed. Accordingly, there has been a demand for a new phase-locked loop circuit that is improved in terms of one or more of the versatility of the natural frequency $\omega n$ and the damping factor $\zeta$, the noise performance, the circuit scale, the ease of calibration, and the design and verification processes. If such a new phase-locked loop circuit is provided, the range of choices of phase-locked loop circuits in accordance with the use thereof can be broadened.

In view of the above-described circumstances, it is desirable to provide a phase-locked loop circuit having a new circuit structure that is different from the structures according to the related art, thereby broadening the range of choices of phase-locked loop circuits in accordance with the use thereof. Preferably, also in the new circuit structure, the natural frequency $\omega n$ and the damping factor $\zeta$ can be varied and calibrated irrespective of the use thereof.

In addition, preferably, an improvement in terms of one or more of the noise performance, the circuit scale, and the design and verification processes is also provided. More preferably, a structure which allows calibrations for variations and temperature characteristics of elements (in particular, resistor elements) included in a loop filter is provided. More preferably, a structure in which the noise performance, the circuit scale, the ease of calibration, and the design and verification processes are balanced is also provided.

In the structure according to an embodiment of the present invention, a loop filter unit includes a series circuit of a resistor circuit and a capacitor circuit. An end of the capacitor circuit opposite the resistor circuit is connected to a reference point. The resistor circuit and the capacitor circuit are driven by two pulse-current output units. One of the pulse-current output units provides a single-end output, and the other provides a differential output. When one of the pulse-current output units provides a single-end output and the other provides a differential output, voltages at both ends the resistor circuit and the capacitor circuit are independent of each other. Therefore, the operation of adjusting the natural frequency and the damping factor independently of each other can be facilitated. In addition, a calibration unit is provided for correcting an oscillation gain of an oscillating unit. Thus, calibration can be performed in accordance with the characteristic variation of the oscillating unit and the temperature variation.

According to an embodiment of the present invention, a new phase-locked loop circuit is provided which is capable of varying the natural frequency and the damping factor without switching between the resistor circuits or the capacitor circuits, as in Patent Document 1. In addition, since the calibration unit which corrects the oscillation gain of the oscillating unit is provided, calibration can be performed in accordance with the characteristic variation of the oscillating unit and the temperature variation. When one loop filter is driven in a single-end mode and the other loop filter in a differential mode, voltages at both ends of the resistor circuit and the capacitor circuit are independent of each other. Therefore, the natural frequency and the damping factor can be easily calibrated.

BRIEF DESCRIPTION OF THE DRAWINGS

FIG. 1A is a block diagram illustrating a read/write apparatus according to an embodiment of the present invention;

FIGS. 10B to 10E are diagrams illustrating an example of a processing procedure performed by the determination processor;

DESCRIPTION OF THE PREFERRED EMBODIMENTS

Figure 1B:
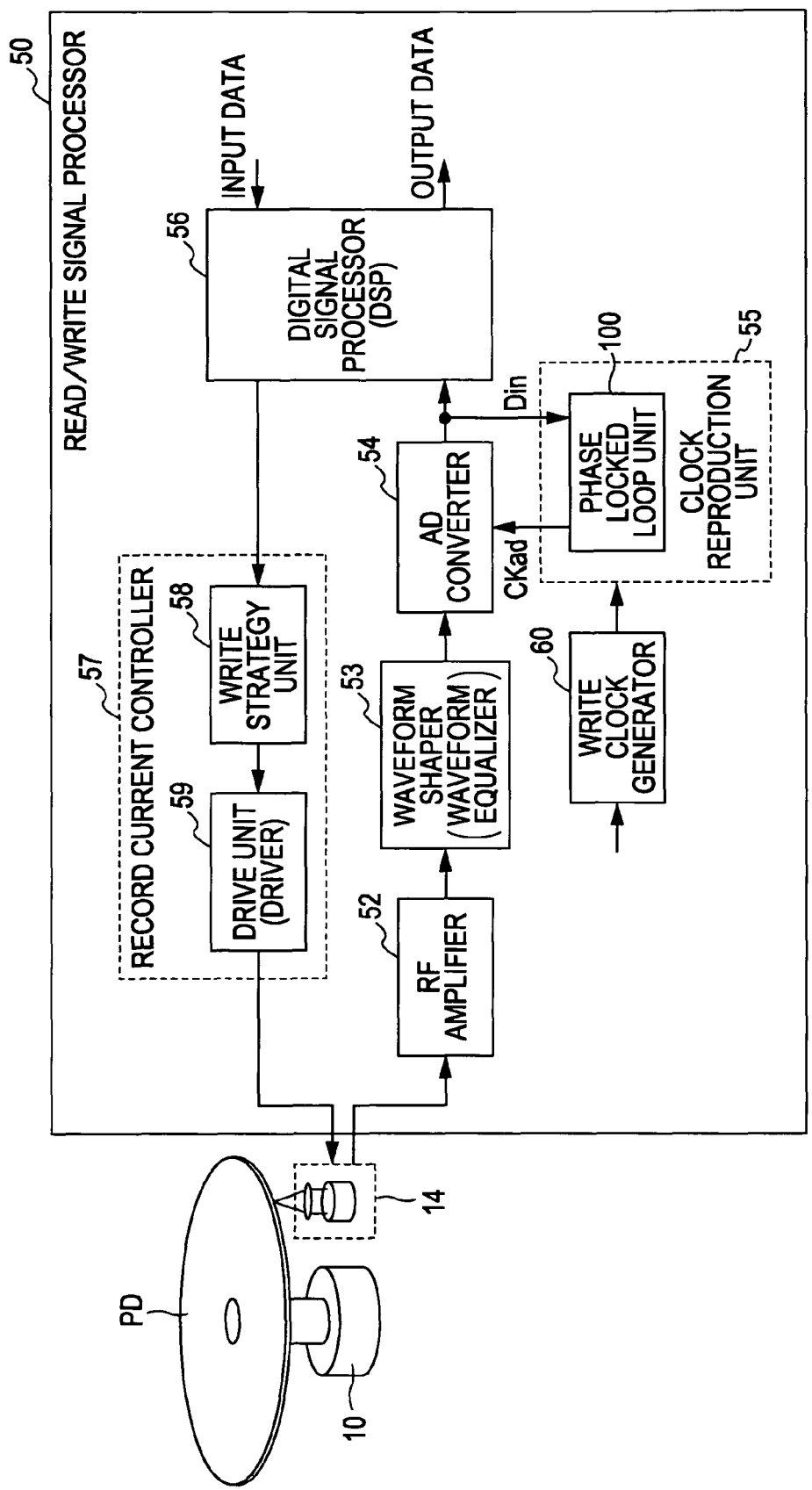
FIG. 1B is a functional block diagram illustrating an example of the structure of a read/write signal processor.

An embodiment of the present invention will be described in detail below with reference to the accompanying drawings. Functional elements corresponding to different examples or modifications are denoted by reference numerals with capital letters A, B, C, . . . , at the end to distinguish them from each other, and the capital letters are omitted when it is not necessary to distinguish them from each other. This also applies to the drawings.

Outline of Read/Write Apparatus

FIG. 1A is a block diagram illustrating a read/write apparatus (optical disk apparatus) according to the embodiment. The read/write apparatus is an example of an electronic apparatus including a phase-locked loop circuit.

A read/write apparatus 1 of the present embodiment includes an optical pickup 14 having a laser source for writing additional information on an optical disk PD (photo disk) or for reading the information recorded on the optical disk PD. The read/write apparatus 1 also includes a servo system, a read/write system, and a controller system as a signal processing system. The servo system of the read/write apparatus 1 includes a rotation servo system, a tracking servo system, and a focus servo system. A system including the tracking servo system and the focus servo system is also referred to as a pickup servo system.

The optical disk PD may be, for example, a so-called read only optical disk, such as a compact disk (CD) or a CD read only memory (CD-ROM), a write once optical disk, such as a CD recordable (CD-R), or a rewritable optical disk such as a CD rewritable (CD-RW). Alternatively, instead of the CD-type optical disk, a magneto-optical disk (MO) or a DVD-type optical disk, such as a common digital video (or versatile) disk (DVD) or a next generation DVD using a blue laser beam with a wavelength of about 407 nm, may also be used. In addition, a so-called double-density CD (DDCD), a double-density CD-R, or a double-density CD-RW, which is based on the current CD format but has a density that is about twice as high as that of the current CD format, may also be used.

The rotation servo system of the read/write apparatus 1 includes a spindle motor 10 which rotates the optical disk PD on which information, such as music, to be reproduced is recorded, a motor driver 12 which drives the spindle motor 10, and a spindle motor controller 30 which is an example of a rotation control unit (rotation servo system) which controls the motor driver 12.

Although not shown in FIG. 1A, the spindle motor controller 30 has a rough servo circuit, a speed servo circuit, a phase servo circuit, and a selector for selectively transmitting outputs from the servo circuits.

The rough servo circuit roughly controls the rotational speed of optical disk PD. The speed servo circuit finely adjusts the rotational speed on the basis of a synchronization signal. The phase servo circuit matches a phase of a reproduction signal to a phase of a reference signal. The selector selectively transmits the outputs from the rough servo circuit, the speed servo circuit, and the phase servo circuit to the motor driver 12.

The optical disk PD is fixed to a rotating shaft $10a$ of the spindle motor 10 by means of a chuck 11. The spindle motor 10 is controlled by the motor driver 12 and the spindle motor controller 30 so that a linear speed is maintained constant. The linear speed can be gradually changed by the motor driver 12 and the spindle motor controller 30.

The read/write apparatus 1 includes a pickup controller 40 which serves as the tracking servo system and the focus servo system. The pickup controller 40 controls the position of the optical pickup 14 with respect to the optical disk PD in a radial direction thereof. Although not shown, the pickup controller 40 includes, for example, a sub-coding detector circuit and a tracking servo circuit. The sub-coding detector circuit reads sub-coding recorded on the optical disk PD. The tracking servo circuit controls the position of the optical pickup 14 with respect to the optical disk PD in the radial direction thereof on the basis of a tracking error signal detected by a tracking error detection circuit (not shown) and address information detected by the sub-coding detector circuit.

The pickup controller 40 controls a tracking actuator and a seek motor (not shown) so that a laser spot formed by a laser beam emitted from the optical pickup 14 is at a desired position (data writing position or data recovery position) on the optical disk PD.

The optical pickup 14 includes a semiconductor laser, an optical system, a focus actuator, the tracking actuator, a light receiving element, a position sensor, etc. (not shown). The optical pickup 14 irradiates a writing surface of the optical disk PD with the laser beam, receives the laser beam reflected by the optical disk PD, and converts the received laser beam into an electric signal. The semiconductor laser included in the optical pickup 14 is driven by a laser driver (not shown). The laser driver drives the semiconductor laser such that the semiconductor laser emits an optical beam with a predetermined recovery power in a data recovery process and an optical beam with a predetermined writing power in an information writing process.

The optical pickup 14 can be moved by the seek motor (slide motor) (not shown) in a sledge (radial) direction. The focus actuator, the tracking actuator, and the seek motor are controlled by the motor driver 12, the spindle motor controller 30, and the pickup controller 40 on the basis of signals obtained from the light receiving element and the position sensor. More specifically, the focus actuator, the tracking actuator, and the seek motor are controlled such that the laser spot of the laser beam is at the desired position (data writing position or data recovery position) on the optical disk PD.

The read/write apparatus 1 also includes a read/write signal processor 50 as a read/write system. The read/write signal processor 50 is an example of an information writing unit which writes information through the optical pickup 14 and an information recovery unit which reproduces the information recorded on the optical disk PD. An example of the structure of the read/write signal processor 50 will be described below. The read/write signal processor 50 includes at least a phase-locked loop unit 100, which is an example of a phase-locked loop circuit.

The read/write apparatus 1 includes a controller 62 which serves as a control system and an interface unit 64 which has a function of interface (IF), that is, connection. The controller 62 is composed of a microprocessing unit (MPU), and controls the operation of the servo system including the spindle motor controller 30 and the pickup controller 40 and the operation of the read/write signal processor 50. The interface unit 64 functions as an interface (connection) between the read/write apparatus 1 and a personal computer 3, which is an example of an information processing apparatus (host apparatus) which performs various information processes using the read/write apparatus 1. The interface unit 64 is provided with a host IF controller. The read/write apparatus 1 and the personal computer 3 form an information read/write system (optical disk system).

In the recovery process performed by the read/write apparatus 1 having the above-described structure, an optical signal is read from the optical disk PD by the optical pickup 14 and is converted into an electric signal by the light receiving element included in the optical pickup 14. The thus-obtained electric signal is transmitted to the servo system (control system) including the spindle motor controller 30 and the pickup controller 40 which control the spindle motor 10 and the optical pickup 14, respectively, and to the read/write signal processor 50 which performs a data read/write operation.

The spindle motor controller 30 and the pickup controller 40 adjust the rotational speed of the spindle motor 10 and the focusing and tracking operations performed by the optical pickup 14 on the basis of the electric signal under the control of the controller 62.

At the same time, the read/write signal processor 50 converts the obtained analog electric signal into digital data and decodes the digital data, and then transmits the decoded data to an apparatus, such as the personal computer 3, which uses the read/write apparatus 1. The personal computer 3 reproduces, for example, image and audio data based on the decoded data.

In the writing process for writing data on the optical disk PD, the spindle motor controller 30 and the pickup controller 40 rotate the optical disk PD at a constant speed under the control of the controller 62. In addition, opposite to the recovery process, the read/write signal processor 50 encodes the data and supplies the encoded data to the laser diode included in the optical pickup 14, so that the electric signal is converted into an optical signal and the information is recorded on the optical disk PD.

Outline of Read/Write Signal Processor

FIG. 1B is a functional block diagram illustrating an example of the structure of the read/write signal processor 50. As shown in FIG. 1B, the read/write signal processor 50 includes an RF amplifier 52, a waveform shaper (waveform equalizer) 53, and an AD converter (analog-to-digital converter (ADC)) 54. The RF amplifier 52 amplifies a low-level RF (high frequency) signal (hereafter also referred to as a reproduction RF signal) read by the optical pickup 14 to a predetermined level. The waveform shaper 53 shapes the reproduction RF signal output from the RF amplifier 52. The signal read by the optical pickup 14 has various frequencies, and the amplitude thereof decreases in a high frequency range. Therefore, intersymbol interference occurs and it becomes difficult to correctly reproduce the data. To prevent this, the waveform shaper 53 carries out waveform equalization for the signal output from the RF amplifier 52. The AD converter 54 converts the analog reproduction RF signal output from the waveform shaper 53 into digital data.

The read/write signal processor 50 also includes a clock reproduction unit 55, a digital signal processor (DSP) 56, a record current controller 57, and a write clock generator 60.

The clock reproduction unit 55 and the write clock generator 60 are examples of signal processors which perform signal processes based on a signal output from the phase-locked loop circuit.

The clock reproduction unit 55 reproduces a clock signal on the basis of a digital data sequence output from the AD converter 54. The clock reproduction unit 55 includes a data recovery phase-locked loop (PLL) circuit which locks onto the digital data (digital data sequence Din) obtained from the AD converter 54 and generates the clock signal. The phase-locked loop unit 100, which will be described below, is used as the phase-locked loop circuit. The clock reproduction unit 55 supplies the reproduced clock signal to the AD converter 54 as an AD clock (sampling clock) CKad and also supplies the reproduced clock signal to other functional parts. The AD converter 54 converts the analog signal into the digital data on the bass of the AD clock CKad.

The digital signal processor 56 performs digital signal processes, such as a process of demodulating the digital data sequence (which corresponds to the reproduction RF signal) output from the AD converter 54 and a process of decoding digital audio data and digital image data.

The record current controller 57 controls (switches on and off) a record current for writing the information on the optical disk PD with the laser beam. The record current controller 57 includes a write strategy unit 58 and a drive unit (laser diode driver) 59. The write strategy unit 58 carries out multi-pulse modulation of optical output power in accordance with the material of the optical disk PD and the writing speed. The drive unit 59 is provided with an auto power control (APC) circuit for maintaining an optical output (optical intensity, optical output power) of the laser beam emitted from the laser source (included in the optical pickup 14) at a constant value.

The write clock generator 60 generates a write clock on the basis of a reference clock supplied from a crystal oscillator or the like. The write clock is used to modulate data in the process of writing the information on the optical disk PD. The write clock generator 60 also includes a phase-locked loop (PLL) circuit, and the phase-locked loop unit 100, which will be described below, is used as the phase-locked loop circuit.

The writing optical beam emitted from the laser source is converted into parallel light by a collimator lens (not shown) included in the optical pickup 14, is caused to pass through a beam splitter (not shown), and is focused by an objective lens (not shown) such that the writing optical beam is incident on the optical disk PD which is rotated by the spindle motor 10. At this time, the writing optical beam is modulated in accordance with the information to be recorded, so that a pit sequence corresponding to the information is formed at a predetermined position (information writing area) on the optical disk PD. Thus, the information is recorded on the optical disk PD. In the present embodiment, the write strategy unit 58 serves to prevent data errors due to deformation of pits (record marks).

Semiconductor lasers using semiconductor devices are widely used as light sources for various apparatuses since the semiconductor lasers are extremely small and are capable of responding to a drive current at a high speed. In addition, phase-change optical disks and magneto-optical disks are widely used as the rewritable optical disk PD which functions as a medium for read/write information. The optical disk PD is irradiated with the laser beam at different output levels depending on whether the information is being recorded, reproduced, or deleted.

In general, in the writing process, the laser beam is emitted at a high output level (for example, 30 mW or more) to form record marks called pits on the optical disk PD. In the recovery process, the laser beam is emitted toward the optical disk PD at a lower output level than that in the writing process (for example, 3 mW) so that the information can be read without damaging the record pits. To make an error rate low enough to allow the read/write processes using high-density, high-transmission-rate optical disks PD which have recently been developed, it is desirable to accurately control the intensity of the laser beam.

The optical output characteristics of the semiconductor laser with respect to the drive current considerably vary in accordance with the temperature variation. Therefore, a so-called APC control circuit, which is a circuit for maintaining the optical output of the semiconductor laser constant, is used to set the optical output to a desired intensity. In the APC control, the laser emission power is maintained constant by forming a negative feedback control loop in which a feedback current obtained by monitoring the optical signal used in the information writing operation is set to a predetermined power reference current.

Here, with the writable optical disk PD that has recently been developed, a mark edge writing method, in which changes at both ends of the record marks are recorded, is mainly used since the method is advantageous in increasing density. To reduce data errors due to deformation of the marks in the mark edge writing method, the write strategy unit 58 uses a write strategy technology in which multi-pulse modulation of the laser output power is performed in accordance with the material of the disk and the writing speed (see, for example, Japanese Unexamined Patent Application Publication 2000-244054).

Phase-Locked Loop Unit; Comparative Example

Figure 2:
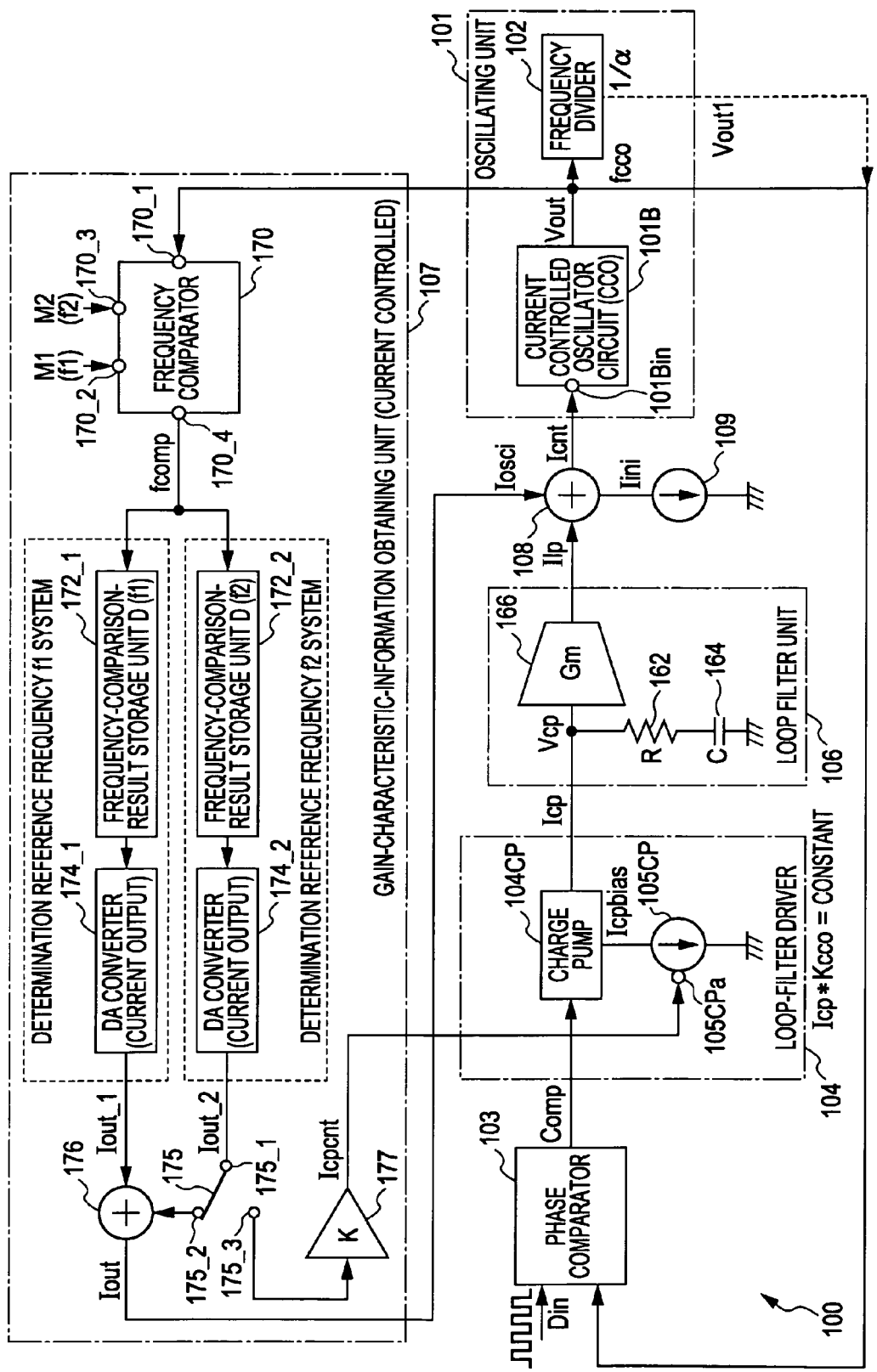
FIG. 2 is a diagram illustrating the circuit structure of a comparative example.

FIG. 2 is a diagram illustrating the circuit structure of a comparative example. The comparative example may be applied to a common PLL structure. Here, the comparative example is a technique for calibrating a natural frequency $\omega n$ and a damping factor $\zeta$ in the structure according to Patent Document 1. Although the case in which the calibration is performed in a common PLL structure will be described, the main part of the PLL circuit may also be replaced by the structure according to Patent Document 1.

The phase-locked loop unit 100 according to the comparative example includes a gain-characteristic-information obtaining unit 107 which corrects an oscillation gain Kosci of an oscillating unit 101. The gain-characteristic-information obtaining unit 107 uses two target frequencies (determination reference frequencies f1 and f2) and obtains oscillation control currents Icnt by combining a predetermined regulation signal In with correction components for causing the oscillating unit 101 to oscillate at the target frequencies. The oscillation control currents Icnt are supplied to the oscillating unit 101 while information regarding a difference between the oscillation control signals corresponding to the two target frequencies is obtained. An input-signal/oscillation-frequency conversion gain Kosci of the oscillating unit 101 in actual operation is determined by the difference between the oscillation control signals. Thus, information representing a control current Icpcnt (example of a correction signal) for compensating for the variation in the input-signal/oscillation-frequency conversion gain Kosci, is obtained. The thus-obtained information is stored in a predetermined storage medium. Then, in an actual phase-locked loop operation, the control current Icpcnt represented by the stored information is used as a correction signal and a loop-filter driver 104 is controlled so as to cancel the variation in the input-signal/oscillation-frequency conversion gain Kosci.

The loop-filter driver 104 includes a charge pump 104CP and a variable current source 105CP. The charge pump 104CP receives a comparison-result signal Comp from a phase comparator 103 and outputs a drive current (hereinafter called a charge-pump current Icp) corresponding to the comparison result signal Comp. The variable current source 105CP supplies a bias current Icpbias to the charge pump 104CP. The variable current source 105CP is capable of controlling the charge-pump current Icp in a current mode.

The phase-locked loop unit 100 includes a current adder 108 and a regulation current source 109. The current adder 108 adds current signals obtained form respective components and supplies the sum of the current signals to a frequency control input terminal 101in of the oscillating unit 101. The regulation current source 109 supplies an initial current Iini which matches a desired oscillation frequency fcco of an output oscillation signal Vout to the current adder 108. The current adder 108 adds the current signals obtained form the respective components to generate the oscillation control current Icnt such that the phase of the output oscillation signal Vout synchronizes with the phase of the digital data sequence Din.

In the case where there are multiple desired frequencies (oscillation frequencies fcco), the optimized initial current Iini is set for each of the desired frequencies (oscillation frequencies fcco). Thus, each time a data rate (frequency) of the digital data sequence Din is switched, the initial current Iini of the regulation current source 109 is switched accordingly. Although not shown in FIG. 2, to switch the initial current Iini, the following structure may be used. That is, a plurality of regulation current sources 109 may be provided for respective frequencies, and initial currents Iini of the regulation current sources 109 may be set so as to correspond to the respective frequencies. Each time the data rate (frequency) of the digital data sequence Din is switched, the regulation current source 109 is changed to another regulation current source 109 which corresponds to the current frequency.

Accordingly, the frequency control current Iosci based on the gain correction process performed by the gain-characteristic-information obtaining unit 107 may be set to a current with which a difference between the desired frequency and the oscillation frequency fcco in actual operation under the initial current Iini (and the loop filter output current Ilp) can be compensated for. As a result, an amount of correction current (frequency control current Iosci) to be supplied by the gain-characteristic-information obtaining unit 107 may be reduced from that in the case where only one initial current Iini corresponding to a certain desired frequency is provided and correction for multiple desired frequencies is performed using the frequency control current Iosci from the gain-characteristic-information obtaining unit 107.

The gain-characteristic-information obtaining unit 107 includes a frequency comparator 170, a first frequency-comparison-result storage unit 172_1, a second frequency-comparison-result storage unit 172_2, and DA converters 174_1 and 174_2. The frequency comparator 170 compares the oscillation frequency fcco of the output oscillation signal Vout output from the oscillating unit 101 with the two determination reference frequencies f1 and f2. The first frequency-comparison-result storage unit 172_1 stores a frequency comparison result fcomp obtained as a result of the comparison between the oscillation frequency fcco and the first determination reference frequency f1 performed by the frequency comparator 170 in the form of N-bit digital data D(f1). The second frequency-comparison-result storage unit 172_2 stores a frequency comparison result fcomp obtained as a result of the comparison between the oscillation frequency fcco and the second determination reference frequency f2 performed by the frequency comparator 170 in the form of N-bit digital data D(f2). The DA converters 174_1 and 174_2 convert the frequency comparison results fcomp stored by the frequency-comparison-result storage units 172_1 and 172_2 in the form of N-bit digital data into analog signals.

The frequency comparator 170 receives the output oscillation signal Vout from the oscillating unit 101 at a signal input terminal 170_1, and receives information representing the determination reference frequencies f1 and f2 at determination reference frequency setting terminals 170_2 and 170_3, respectively. The frequency comparator 170 outputs the frequency comparison results fcomp from a determination result output terminal 170_4.

The frequency comparator 170 determines the magnitude relationship between the oscillation frequency fcco of the output oscillation signal Vout output from the oscillating unit 101 and each of the determination reference frequencies f1 and f2, which serve as target frequencies, and outputs the frequency comparison results fcomp obtained as a result of the determination to the frequency-comparison-result storage units 172_1 and 172_2.

The frequency-comparison-result storage unit 172_2 stores N-bit digital data corresponding to the frequency difference between the determination reference frequencies f1 and f2. Since the data corresponds to the frequency difference between the determination reference frequencies f1 and f2, the N-bit digital data stored in the second frequency-comparison-result storage unit 172_2 reflects the input-signal/oscillation-frequency conversion gain Kosci of the oscillating unit 101.

The gain-characteristic-information obtaining unit 107 also includes a path selection switch 175, a current adder 176, and a current-current converter 177. The path selection switch 175 switches a path for an output current signal Iout_2 fed from the second DA converter 174_2 to the path selection switch 175 at an input terminal 175_1. The current adder 176 adds an output current signal Iout_1 from the first DA converter 174_1 and the output current signal Iout_2 obtained from the second DA converter 174_2 through an output terminal 175_2 of the path selection switch 175. The current-current converter 177 amplifies the output current signal Iout_2 obtained from the second DA converter 174_2 through another output terminal 175_3 of the path selection switch 175 by a factor of K (K is a current mirror ratio, as described below).

The DA converters 174_1 and 174_2 successively generate the output current signals Iout_1 and Iout_2, which are examples of frequency control signals, in the order of bits on the basis of the frequency comparison results stored in the frequency-comparison-result storage units 172_1 and 172_2 for the determination reference frequencies f1 and f2, respectively. Although the oscillation frequency fcco does not become equal to the determination reference frequencies f1 and f2 at an intermediate point in the sequence of bits, the oscillation frequency fcco becomes equal to the determination reference frequencies f1 and f2 in the output current signals Iout_1 and Iout_2 which are finally obtained.

The current adder 176 adds the output current signal Iout_1 output from the DA converter 174_1 for the determination reference frequency f1 and the output current signal Iout_2 output from the DA converter 174_2 for the determination reference frequency f2. The thus-obtained sum is supplied to the current adder 108, which is an example of an oscillation control signal generator, as the final frequency control current Iosci (frequency control signal).

The frequency-comparison-result storage unit 172_1 and the DA converter 174_1 form a system for the first determination reference frequency f1, which is the first target frequency. The system for the first determination reference frequency f1, the frequency comparator 170, and the current adder 176 form a first frequency control signal obtaining unit for obtaining the output current signal Iout_1 as a first frequency control signal for the first determination reference frequency f1. The output current signal Iout_1 is the difference from the regulation signal In used to set the oscillation frequency fcco of the output oscillation signal Vout output from the current controlled oscillator circuit 101B to be equal to the first determination reference frequency f1 (first target frequency).

The frequency-comparison-result storage unit 172_2 and the DA converter 174_2 form a system for the second determination reference frequency f2, which is the second target frequency. The system for the second determination reference frequency f2, the frequency comparator 170, and the current adder 176 form a second frequency control signal obtaining unit for obtaining the output current signal Iout_2 as a second frequency control signal for the second determination reference frequency f2. The output current signal Iout_2 is the difference from a signal obtained by correcting the regulation signal In, which is used to set the oscillation frequency fcco of the output oscillation signal Vout output from the oscillating unit 101 to be equal to the second determination reference frequency f2 (second target frequency), with the output current signal Iout_1 (first frequency control signal).

The path selection switch 175 switches the path of the output current signal Iout_2 output from the second DA converter 174_2 for the determination reference frequency f2 such that the output current signal Iout_2 is supplied to the current adder 176 in a correction information obtaining process and to the loop-filter driver 104, which is an example of a driving unit 104Z, in a normal phase-locked loop operation.

The current adder 176 supplies the sum (Iout) of the output current signal Iout_1 and the output current signal Iout_2 to the current adder 108 as the frequency control current Iosci. The current-current converter 177 amplifies the output current signal Iout_2 from the second DA converter 174_2 by a factor of K, and supplies the amplified current to a control input terminal 105CPa of the variable current source 105CP as the control current Icpcnt.

The frequency comparator 170 compares the oscillation frequency fcco of the output oscillation signal Vout with the determination reference frequencies f1 and f2 to determine the magnitude relationship, and outputs the frequency comparison result fcomp in the from of digital data 0 or 1. For example, "1" is output if the oscillation frequency fcco is greater than the determination reference frequencies f1 and f2, and "0" is output if the oscillation frequency fcco is less than the determination reference frequencies f1 and f2. Thus, the N-bit data is not obtained as the comparison result if the oscillation frequency fcco of the output oscillation signal Vout is simply compared with the determination reference frequencies f1 and f2 by the frequency comparator 170.

The frequency control current Iosci which reflects the frequency comparison result fcomp obtained by the frequency comparator 170 is set such that the oscillation frequency fcco of the output oscillation signal Vout becomes closer to the determination reference frequencies f1 and f2, and the thus obtained frequency control current Iosci is supplied to the oscillating unit 101. Then, the comparison between the oscillation frequency fcco of the output oscillation signal Vout and the determination reference frequencies f1 and f2 is repeated (N times in total) by the frequency comparator 170. Thus, a frequency binary search method is performed. Each time the comparison is repeated (N times in total), the weight of the comparison result decreases.

In response to the comparison process performed N times by the frequency comparator 170, each of the frequency-comparison-result storage units 172_1 and 172_2 stores the first frequency comparison result fcomp at a highest order bit and successively stores the following frequency comparison results fcomp at the lower order bits. Thus, the frequency-comparison-result storage units 172_1 and 172_2 successively store the frequency comparison results fcomp for the determination reference frequencies f1 and f2 obtained by the frequency comparator 170 at the bits in the order of bit weighting.

As a result, the N-bit digital data is stored in each of the frequency-comparison-result storage units 172_1 and 172_2. Since the search is repeated N times, the frequency-comparison-result storage units 172_1 and 172_2 store the N-bit digital data which represent the output current signals Iout_1 and Iout_2 with which the oscillation frequency fcco of the output oscillation signal Vout gradually becomes closer to the determination reference frequencies f1 and f2.

The current adder 108 adds the initial current Iini which is supplied from the regulation current source 109 and which matches with the desired oscillation frequency fcco of the output oscillation signal Vout, the loop filter output current Ilp output from a voltage-current converter 166, and the frequency control current Iosci supplied from the current adder 176 of the gain-characteristic-information obtaining unit 107. The thus-obtained current is supplied to a frequency control input terminal 101in of the oscillating unit 101 as the oscillation control current Icnt.

The current-current converter 177 receives the output current signal Iout_2 from the DA converter 174_2. The output current signal Iout_2 is obtained as a result of the correction process performed by the gain-characteristic-information obtaining unit 107 and is based on the data stored in the frequency-comparison-result storage unit 172_2. The current-current converter 177 serves as a signal converter which generates the control current Icpcnt to be supplied to the current source 105CP by amplifying the output current signal Iout_2 by a factor of K (method for setting K will be described below).

The phase-locked loop unit 100 having the above-described structure performs a calibration process as follows. That is, first, gain calibration of the oscillating unit 101 is performed before the operation as the PLL is started. When the calibration process is started, the operations of the phase comparator 103 and the loop-filter driver 104 are stopped and an initial current or an initial voltage is applied to the oscillating unit 101 to oscillate the oscillating unit 101. Then, the oscillation frequency is measured using an external reference clock, and is compared with a determination reference frequency A by the frequency comparator 170. The result of the comparison is successively stored in the frequency-comparison-result storage unit 172_1 in the order from high-order bits, and thus-stored results are successively used to operate the DA converter 174_2 in the order from high-order bits. Then, outputs from DA converter 174_2 are added to or subtracted from the input for the oscillating unit 101. The comparison is repeated N times so that the oscillation frequency of the oscillating unit 101 becomes equal to the frequency fa used as the determination reference frequency A. Then, the determination reference frequency for the frequency comparator 170 is changed to a determination reference frequency B, and the frequency is set equal to a frequency fb used as the determination reference frequency B by a similar method. Then, the path selection switch 175 switches the path for the output of the DA converter 174_2 from the path to oscillating unit 101 to the path to current-current converter 177. The output of the DA converter 174_2 is amplified by a factor of K and is used as a bias current for the current source 105CP.

In the above-described structure, the oscillation gain Kosci (CCO circuit gain Kcco or VCO circuit gain Kvco) of the oscillating unit 101 can be calibrated. Therefore, in the case where the constants (resistance R and capacitance C) of the loop filter unit 106 are constant, the natural frequency ωn and the damping factor ζ of the PLL circuit can be maintained constant.

However, in the above-described comparative example, the following problems occur. The first problem is noise performance. More specifically, circuits related to the input terminal of the oscillating unit 101 include the regulation current source 109 (initial-value bias circuit), the DA converters 174_1 and 174_2, and the current adder 108 which adds the currents therefrom. These circuits are analog circuits, and noises generated in the circuits are added at the input terminal of the oscillating unit 101. Therefore, each circuit preferably has low-noise performance. The jitter performance, which depends on the amount of noise in the PLL circuit, is the most important performance for the PLL circuit. The addition of the above-mentioned circuits degrades the jitter performance of the PLL circuit. In addition, in the case where the above-mentioned structure is used in combination with the structure of Patent Document 1, the Gm circuit also degrades the jitter performance. In addition, the jitter performance is also degraded in the case where an additional resistance or a current squared correction circuit is used.

The second problem is a calibration method. In the above-described calibration method, the calibration information of the oscillation gain Kosci (CCO circuit gain Kcco or VCO circuit gain Kvco) is fed back to the current source 105CP of the loop-filter driver 104 as a bias current. Therefore, when the oscillation gain Kosci largely varies, the calibrated CP circuit gain Kcp also largely varies in inverse proportion to the variation in the oscillation gain Kosci. Therefore, the design and verification processes of the loop-filter driver 104 are difficult.

The third problem is the area. In the comparative example, two N-bit DAC (DA converters 174_1 and 174_2) are provided in the gain-characteristic-information obtaining unit 107, and the calibration accuracy and the calibration range for the oscillation gain Kosci are determined by the two N-bit DAC. Therefore, it is difficult to reduce the circuit area in consideration of the noise and variations between the devices.

The fourth problem is the design and verification processes. Since analog circuits are included in the components other than the PLL main unit, the design and verification processes are complex.

Accordingly, a compact circuit structure is provided which provides versatility for the natural frequency ωn and the damping factor ζ and which allows easy adjustment of either one of the natural frequency ωn and the damping factor ζ while the other is maintained constant. In this structure, independencies of a current path to a resistor element 162 (hereinafter referred to as an RD path) and a current path to a capacitor element 164 (hereinafter referred to as a CP path)

are ensured. According to the present embodiment, a phase-locked loop circuit including a calibration circuit suitable for such a structure is provided. A phase-locked loop unit 100 according to the present embodiment will now be described.

Phase-Locked Loop Unit; Basic Structure

Figure 3:
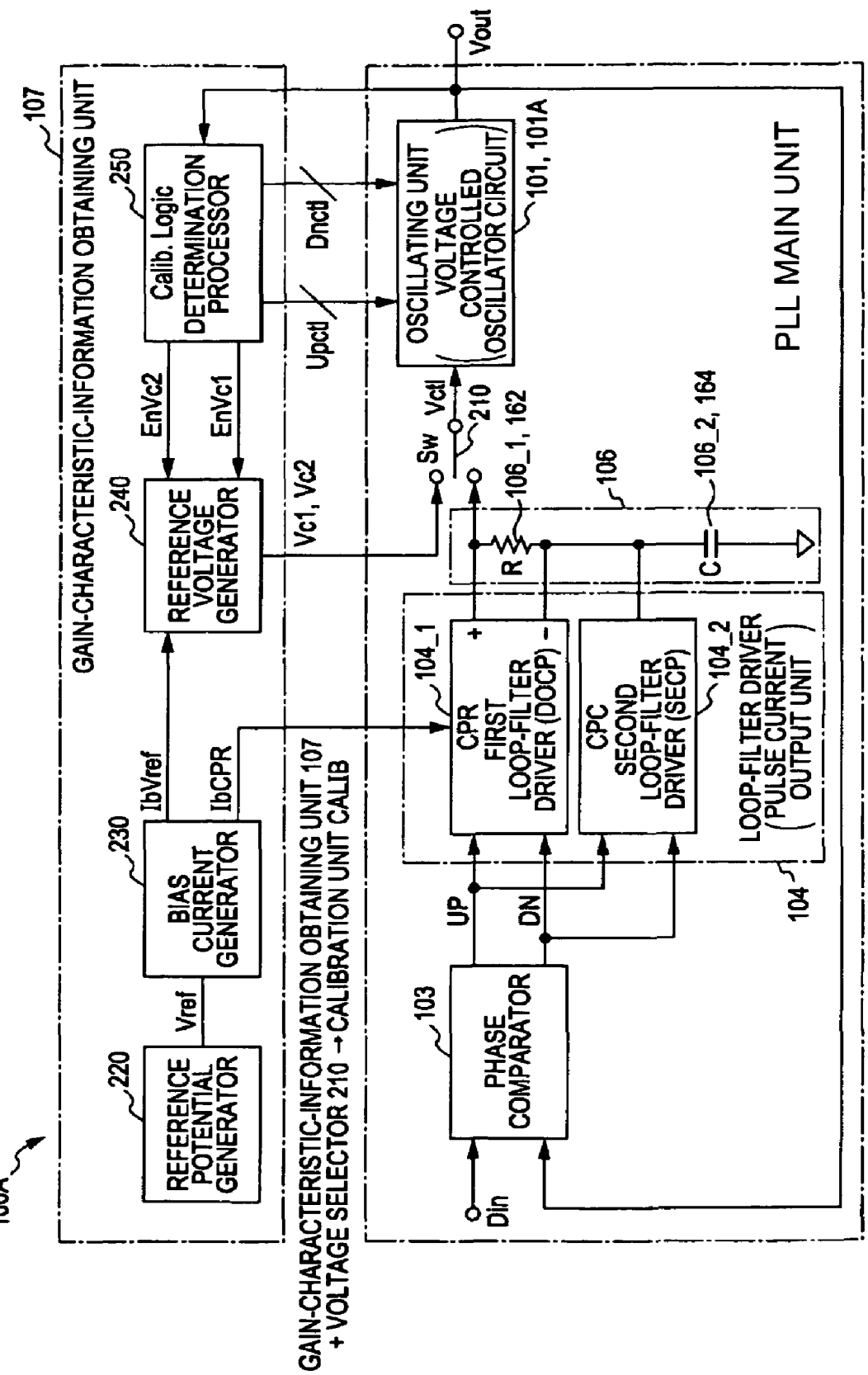
FIG. 3 is a diagram illustrating the basic structure of a phase-locked loop unit according to the embodiment.
Figure 4:
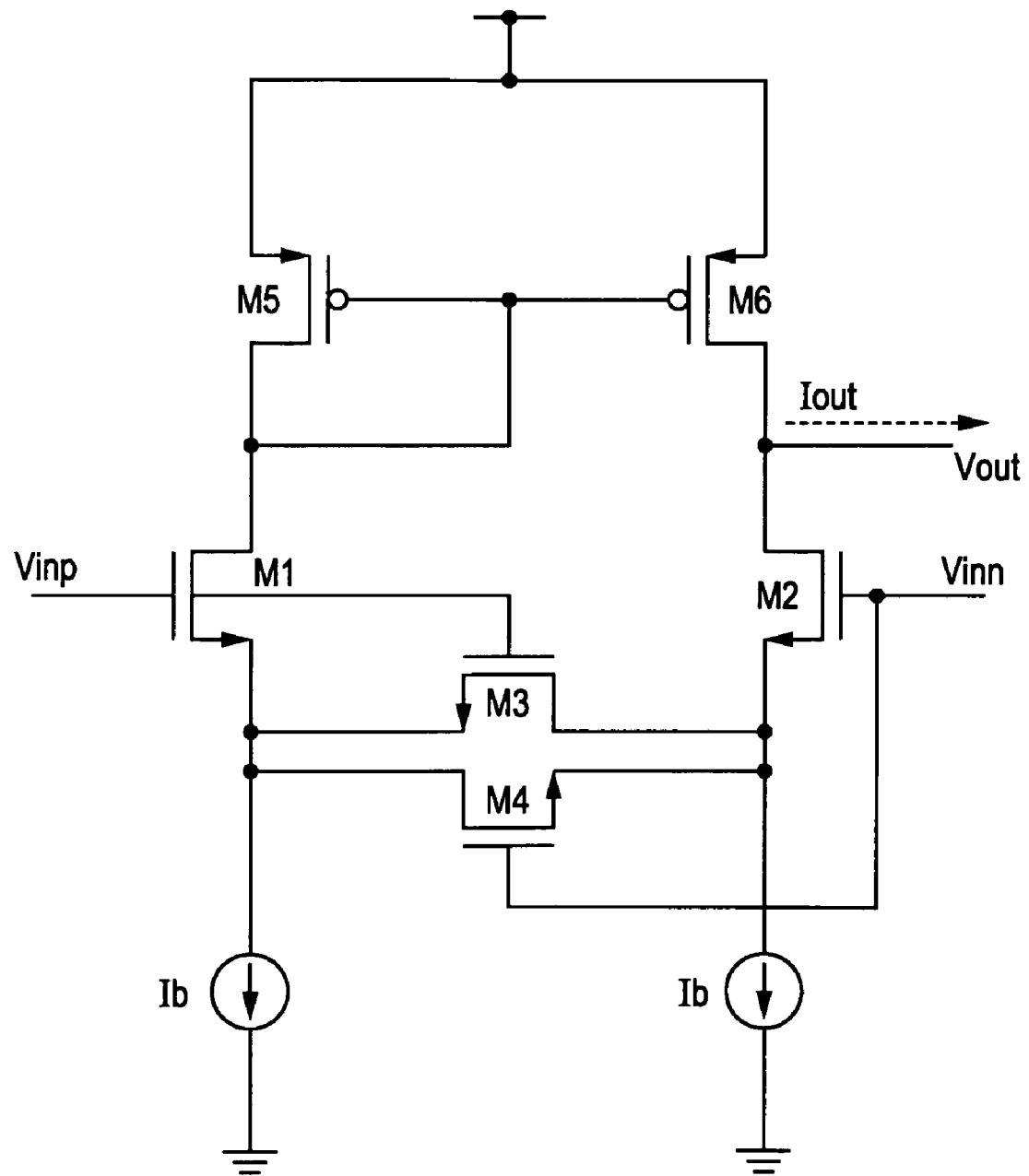
FIG. 4 is a diagram illustrating a linear Gm circuit according to a comparative example.

FIG. 3 is a diagram illustrating the basic structure of a phase-locked loop unit 100 according to the embodiment. FIG. 4 is a diagram illustrating a linear Gm circuit according to the comparative example. The basic structure of the phase-locked loop unit 101A according to the present embodiment is similar to that of the common phase-locked loop unit in that the phase-locked loop unit includes an oscillating unit 101, a phase comparator 103, a loop-filter driver 104 including a charge pump circuit, and a loop filter unit 106. The system including the oscillating unit 101, the phase comparator 103, the loop-filter driver 104, and the loop filter unit 106 is called a PLL main unit.

In addition to the PLL main unit, the phase-locked loop unit 100A according to the present embodiment includes a gain-characteristic-information obtaining unit 107 having a calibration function for compensating for the manufacturing variations and the temperature characteristics of the frequency conversion gain of the oscillating unit 101. The gain-characteristic-information obtaining unit 107 includes a reference potential generator 220, a bias current generator 230 having a reference resistor 239, a reference voltage generator 240, and a determination processor 250.

The phase-locked loop unit 100A includes a voltage selector 210 having a switch structure between the loop filter unit 106 and the oscillating unit 101. The voltage selector 210 functions as a switching mechanism for supplying a function of the gain-characteristic-information obtaining unit 107 to the PLL main unit. Thus, the phase-locked loop unit 100A according to the present embodiment is obtained by adding the gain-characteristic-information obtaining unit 107 to the PLL main unit, which is the basic structure of a phase-locked loop circuit.

The gain-characteristic-information obtaining unit 107 and the voltage selector 210 form a calibration unit CALIB. The calibration unit CALIB uses a plurality of oscillation control signals with predetermined magnitudes to obtain information of oscillation gain Koscic of the oscillating unit 101 in the actual operation on the basis of differences in the actual oscillation frequency under each of the oscillation control signals. In addition, the calibration unit CALIB corrects operation currents (source current and oscillation bias current) for causing the oscillating unit 101 to perform an oscillation operation on the basis of a difference between the oscillation gain Koscic in the actual operation and a target oscillation gain Koscit.

Although the correction may be performed in a voltage mode, the correction is performed in a current mode in the present embodiment since the addition of the amounts of currents can be performed easily in view of suitably varying the amount of correction. Therefore, the oscillating unit 101 includes a current correction unit (current source) and a current control oscillation circuit. In the case where the correction is performed in the current mode, a circuit structure is arranged in consideration of noise resistance performance.

FIG. 4 illustrates a linear Gm circuit according to the comparative example. In this structure, a voltage (current) including external noise is applied to a current source of a current Ib, Vinn (inverting input), Vinp (non-inverting input), etc., as a bias. Therefore, noise other than the noise of components, such as transistors, and the noise of the structure itself is applied to the structure. This noise propagates through the liner Gm circuit and is output with the output current Iout. In the present embodiment, a circuit structure in which the bias noise other than the noise output from transistors included in the Gm circuit can be excluded is used. The circuit structure will be described below with reference to FIGS. 8A and 8B.

The loop filter unit 106 includes a series circuit of a first loop filter circuit 106_1 and a second loop filter circuit 106_2. The term "loop filter circuit" is a generic term including individual elements, such as a resistor element or a capacitor element, included in a circuit structure and series or parallel circuits including such elements.

The first loop filter circuit 106_1 is a resistor circuit which may include a resistor element and a capacitor element but the resistor element serves as a major element. In the present embodiment, a resistor element 162 is used as the first loop filter circuit 106_1. The resistor element 162 is matched with the reference resistor 239 in the bias current generator 230.

The matching between the elements means that the matched elements have at least the same temperature variation characteristics. The simplest method for matching the elements is to form the reference resistor 239 and the resistor element 162 on a single chip. Alternatively, resistor elements having the same temperature characteristics may, of course, be provided outside a chip. It is preferable to avoid using different types of resistor elements, such as a carbon resistor and a metal-film resistor, since they have different temperature variation characteristics.

The second loop filter circuit 106_2 is an integrating circuit (capacitor circuit) which includes a resistor element and a capacitor element but the capacitor element serves as a major element. For example, in the present embodiment, a capacitor element 164 is used as the second loop filter circuit 106_2. In the present embodiment, the resistor element 162 is connected to a connection point (node ND101) between the loop-filter driver 104 and the oscillating unit 101 at one end and to an end of the capacitor element 164 at the other end. The connection point between the resistor element 162 and the capacitor element 164 is hereinafter called a node ND 102. The other end of the capacitor element 164 is connected to a reference point (ground or a negative source, hereinafter the same). In the case where the manner in which the capacitor element 164 and the resistor element 162 are connected is reversed, there will be a problem that it is difficult to apply the current of the RD path. However, in the above-described connection, such a problem does not occur. In the case where the phase-locked loop unit 100 is formed of a semiconductor integrated circuit (IC), the resistor element 162 is preferably included in the IC, and the capacitor element 164 is disposed outside the IC and is connected to the IC.

The loop-filter driver 104 included in the phase-locked loop unit 100A of the present embodiment includes a first loop-filter driver 104_1 for driving the first loop filter circuit 106_1 and a second loop-filter driver 104_2 for driving the second loop filter circuit 106_2. The first loop-filter driver 104_1 and the second loop-filter driver 104_2 receive a common up signal UP and a common down signal DOWN (also generically referred to as an up/down signal UP/DOWN) as a comparison output from the phase comparator 103. The up/down signal UP/DOWN is an error signal (phase error information) representing a phase difference obtained as a result of a comparison between the phases of the digital data sequence Din and the output oscillation signal Vout. Although the first loop-filter driver 104_1 and the second loop-filter driver 104_2 use the up/down signal UP/DOWN from the phase comparator 103 as a common signal, operations thereof are independent of each other.

In the basic structure of the present embodiment, the first loop-filter driver 104_1 has a differential output structure which differentially outputs a pulse current with a pulse width corresponding to the phase error information to the first loop filter circuit 106_1. The second loop-filter driver 104_2 has a single-end output structure which outputs a pulse current with a pulse width corresponding to the phase error information to the second loop filter circuit 106_2. The first loop-filter driver 104_1 is an example of a differential pulse output unit and the second loop-filter driver 104_2 is an example of a single-end pulse output unit. The oscillation frequency of the oscillating unit 101 can be varied by varying the output currents from the pulse output units.

The first loop-filter driver 104_1 outputs a differential-output pulse current corresponding to the phase error information on the basis of the up/down signal UP/DOWN from the phase comparator 103. For example, the first loop-filter driver 104_1 is connected to a connection point (node ND101) between the resistor element 162 and the oscillating unit 101 at a positive-phase output terminal (OUT+) thereof and to a connection point between the resistor element 162 and the capacitor element 164 at a negative-phase output terminal (OUT−) thereof.

In the phase-locked loop unit 100A according to the present embodiment including the gain-characteristic-information obtaining unit 107, the first loop-filter driver 104_1, which is an example of a differential pulse output circuit, outputs a differential-output pulse current in accordance with the up/down signal UP/DOWN (phase error information) from the phase comparator 103 and a bias current IbCP (bias current IbCPR in this example) from the bias current generator 230.

The second loop-filter driver 104_2 outputs a single-end-output pulse current corresponding to the phase error information on the basis of the up/down signal UP/DOWN from the phase comparator 103. The single-end output terminal (OUT) of the second loop-filter driver 104_2 is connected to the connection point between the resistor element 162 and the capacitor element 164.

Thus, in this example, the negative-phase output terminal (OUT−) of the first loop-filter driver 104_1 and the output terminal of the second loop-filter driver 104_2 are both connected to the connection point between the resistor element 162 and the capacitor element 164. The oscillation frequency of the oscillating unit 101 can be varied in accordance with the voltage at the node ND101 connected to the positive-phase output terminal (OUT+) of the first loop-filter driver 104_1.

In the present embodiment, the first loop-filter driver 104_1 includes a differential-output charge pump circuit DOCP which outputs a differential-output pulse current corresponding to the phase error information. The second loop-filter driver 104_2 includes a single-end charge pump circuit SECP which outputs a single-end-output pulse current corresponding to the phase error information. The charge pump circuits are simple, and are preferably used as the pulse-current output units for generating the pulse currents corresponding to the phase information.

The differential-output charge pump circuit DOCP differentially outputs the pulse current to the resistor element 162, and the single-end charge pump circuit SECP normally outputs the pulse current to the capacitor element 164. The differential pulse current from the differential-output charge pump circuit DOCP flows through both ends of the resistor element 162. The single-end pulse current from the single-end charge pump circuit SECP flows to the capacitor element 164.

It is not necessary that the first loop-filter driver 104_1 and the second loop-filter driver 104_2 include charge pump circuits as long as the differential pulse current can be output from the first loop-filter driver 104_1 and the single-end pulse current can be output from the second loop-filter driver 104_2. For example, DA converter (digital to analog converter (DAC)) circuits which output differential-output and single-end-output currents may also be used. Also in this case, the loop-filter driver 104 for driving the resistor circuit (resistor element 162) in the loop filter unit 106 is configured to generate a pulse current with a magnitude corresponding to the bias current IbCPR generated by the bias current generator 230.

If there is a difference between a source current and a sink current at the positive-phase output terminal (OUT+) and the negative-phase output terminal (OUT−) of the differential-output charge pump circuit DOCP, the difference serves as a current for charging the capacitor element 164. In the present embodiment, the difference is set to 0 so that the voltage generation at the resistor element 162 and the voltage generation at the capacitor element 164 can be performed independently of each other. Due to this characteristic, the natural frequency ωn and the damping factor ζ can be varied by changing the gains of the two pulse current output circuits (charge pump circuits in this example), and the control equations thereof can be simplified.

An input terminal of the voltage selector 210 disposed between the loop filter unit 106 and the oscillating unit 101 is connected to the node ND101 (output of the first loop-filter driver 104_1). Another input terminal of the voltage selector 210 is connected to the reference voltage generator 240. An output terminal of the voltage selector 210 is connected to the oscillating unit 101.

Either a voltage controlled oscillator circuit 101A or a current controlled oscillator circuit 101B may be used as the oscillating unit 101 disposed downstream of the loop-filter driver 104. In the case where the voltage controlled oscillator circuit 101A is used, the voltage (Vr+Vc) at the node ND101 may be supplied to a frequency control input terminal 101Ain for the oscillating operation. Here, the voltage Vr is the voltage at both ends of the resistor element 162 and the voltage Vc is the voltage at both ends of the capacitor element 164.

In the case where the current controlled oscillator circuit 101B is used, two voltage-current converters 166_1 and 166_2 and a current adder 168 is provided. One voltage-current converter 166_1 has a voltage-current conversion gain Gm1 and converts the voltage (Vr+Vc) at the node ND101 into an oscillation control current Icnt_1. The other voltage-current converter 166_2 has a voltage-current conversion gain Gm2 and converts the voltage Vc at the node ND102 into an oscillation control current Icnt_2. The current adder 168 combines the oscillation control currents Icnt_1 and Icnt_2 to generate an oscillation control current Icnt, and supplies the oscillation control current Icnt to a frequency control input terminal 101Bin of the current controlled oscillator circuit 101B.

A frequency divider 102 which divides the oscillation frequency fcco of the output oscillation signal Vout into 1/α to generate a frequency-divided oscillation signal Vout1 may be disposed downstream of the voltage controlled oscillator circuit 101A or the current controlled oscillator circuit 101B. Here, α is a division ratio that is variable, and is set to a positive integer, preferably a power of 2.

In the present embodiment, considering the connection relationship between the loop-filter driver 104 and the loop filter unit 106, the voltage controlled oscillator circuit 101A is preferably used since the circuit structure can be simplified.

In such a case, the voltage-current converter 166 (transconductance) with the voltage-current conversion gain Gm can be omitted and therefore the influence of the conversion characteristic of the voltage-current converter 166 can be eliminated. In addition, noise resistance performance can be improved.

The components of the gain-characteristic-information obtaining unit 107 will now be described. The reference potential generator 220 is a constant voltage source circuit which outputs a constant reference voltage Vref. For example, a voltage source, such as a band gap reference (BGR), which has no process or temperature dependency may be used as the reference potential generator 220.

The bias current generator 230 is a bias current source circuit which generates a bias current. The bias current generator 230 generates the bias current IbCp for the first loop-filter driver 104_1 and the bias current IbVref for the reference voltage generator 240 on the basis of the reference voltage Vref output from the reference potential generator 220 and the reference resistor 239.

The determination processor 250 is a main part of the gain-characteristic-information obtaining unit 107. The determination processor 250 supplies voltage switching control signals EnVc1 and EnVc2 used by the reference voltage generator 240 to selectively generate two VCO control voltages Vc1 and Vc2 to the reference voltage generator 240. Thus, the characteristic of frequency with respect to the oscillation control signal (voltage or current) can be calibrated on the basis of the output oscillation signal Vout from the oscillating unit 101. The determination processor 250 determines the characteristic Kosci of frequency with respect to the oscillation control signal on the basis of the output clock obtained from the oscillating unit 101, and controls the oscillating unit 101 such that the desired characteristic Kosci can be obtained. The VCO control voltages Vc1 and Vc2 are oscillation control signals for correction (correction control signals) used in the calibration process. The reference voltage generator 240 is an example of a correction control signal generator which generates the oscillation control signals for correction (VCO control voltages Vc1 and Vc2).

The reference voltage generator 240 selectively generates the two VCO control voltages Vc1 and Vc2 necessary for the gain calibration on the basis of the two voltage switching control signals EnVc1 and EnVc2 from the determination processor 250 using the bias current IbVref from the bias current generator 230 as a reference. The VCO control voltages Vc1 and Vc2 serve as an oscillation reference voltage corresponding to the second bias current generated by the bias current generator 230. The thus-generated VCO control voltages Vc1 and Vc2 are input to the second input terminal of the voltage selector 210.

Charge Pump Unit

Figure 5A:
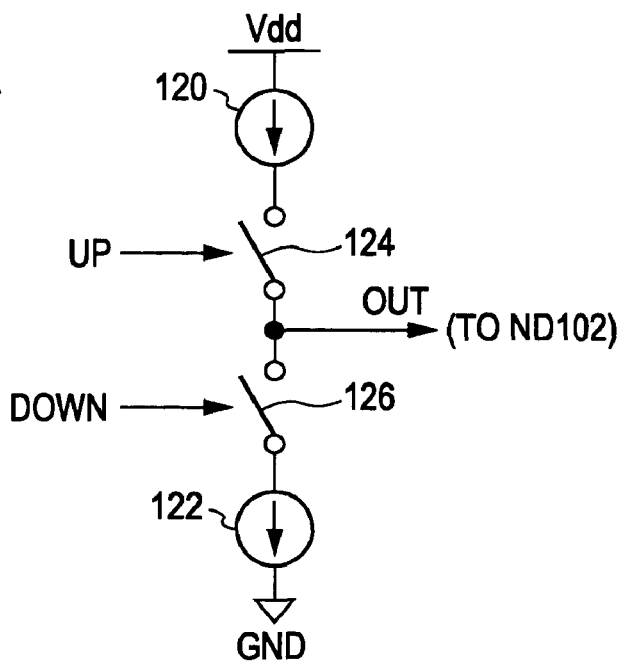
FIGS. 5A and 5B illustrate examples of the structures of charge pump circuits.
Figure 5B:
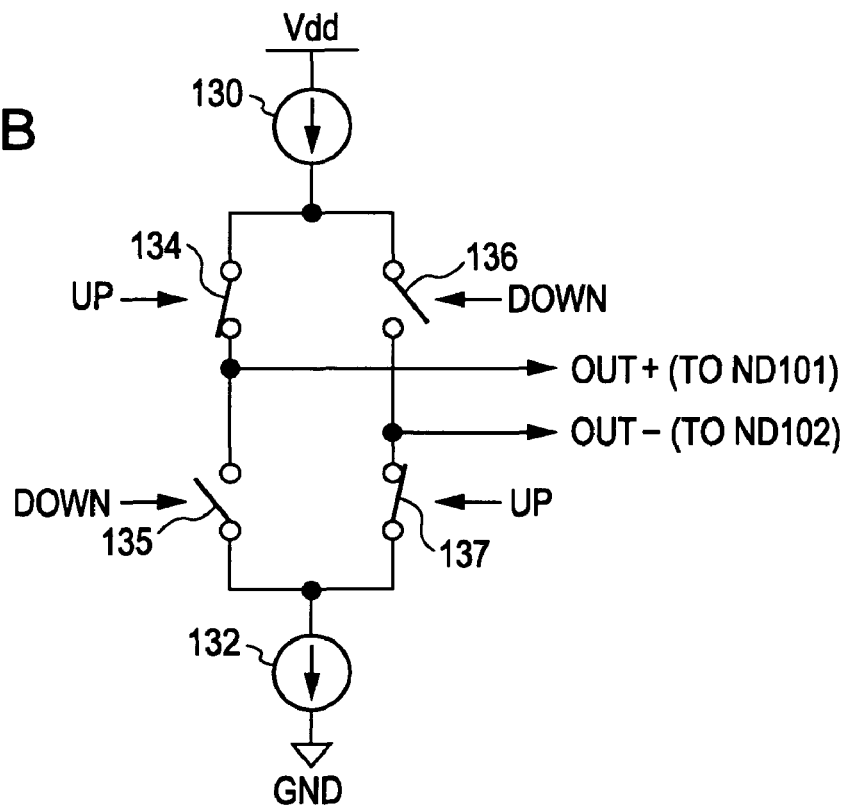

FIG. 5A is a diagram illustrating an example of the structure of the single-end charge pump circuit SECP. FIG. 5B is a diagram illustrating an example of the structure of the differential-output charge pump circuit DOCP. As shown in FIG. 5A, the single-end charge pump circuit SECP having a single-end output connected to the node ND102 includes a source-current source 120 provided at a positive source side to generate a constant source current, a sink-current source 122 provided at a reference side to generate a constant sink current, and two control switches 124 and 125. The single-end charge pump circuit SECP outputs or receives a pulse current Iout+ having a pulse width corresponding to the up/down signal UP/DOWN through an output terminal (OUT) thereof. The amount of the source current I_120 generated by the source-current source 120 and the amount of the sink current I_122 generated by the sink-current source 122 are equal to each other.

The control switch 124 is connected between the source-current source 120 and the single-end output terminal (OUT), and the control switch 125 is connected between the sink-current source 122 and the single-end output terminal (OUT). The control switch 124 receives the up signal UP from the phase comparator 103 and the control switch 125 receives the down signal DOWN from the phase comparator 103.

The up signal UP and the down signal DOWN represent the phase error information detected by the phase comparator 103. Normally, the up signal UP and the down signal DOWN do not become active at the same time. While the up signal UP is active, the control switch 124 is switched on and the source current from the source-current source 120 is supplied to the capacitor element 164, which functions as load. Thus, the pair of current sources 120 and 122 perform a source operation. While the down signal DOWN is active, the control switch 125 is switched on and the sink current flows from the capacitor element 164, which functions as load, to the sink-current source 122. Thus, the pair of current sources 120 and 122 perform a sink operation. Thus, the single-end charge pump circuit SECP outputs or receives a pulsed drive current (hereinafter called a charge-pump current) corresponding to the phase error information detected by the phase comparator 103 to/from the capacitor element 164. The capacitor element 164 (node ND102) is controlled by the single-end charge pump circuit SECP such that the voltage Vc is generated at the ends of the capacitor element 164. The voltage Vc can be adjusted by controlling a width Δt of an active period of the up signal UP or the down signal DOWN.

The operation of the differential-output charge pump circuit DOCP having the differential outputs connected to the ends of the resistor element 162 (the node ND101 and the node ND102) is similar to that of the single-end charge pump circuit SECP except that a differential output is provided. More specifically, control switches 134 to 137 are switched on or off in accordance with the up/down signal UP/DOWN, and the differential currents corresponding to the up/down signal UP/DOWN are output accordingly. The differential charge pump circuit can be easily obtained simply by adding switching elements to the structure of the single-end charge pump circuit SECP.

More specifically, as shown in FIG. 5B, the differential-output charge pump circuit DOCP includes a source-current source 130 provided at a positive source side to generate a constant source current, a sink-current source 132 provided at a reference side to generate a constant sink current, and four control switches 134, 135, 136, and 137. The differential-output charge pump circuit DOCP outputs or receives a pulse current Iout+ and a pulse current Iout- having a pulse width corresponding to the up/down signal UP/DOWN through the positive-phase output terminal (OUT+) and the negative-phase output terminal (OUT-), respectively. The amount of the source current I_130 generated by the source-current source 130 and the amount of the sink current I_132 generated by the sink-current source 132 are equal to each other.

The control switch 134 is connected between the source-current source 120 and the positive-phase output terminal (OUT+) and the control switch 135 is connected between the sink-current source 132 and the positive-phase output terminal (OUT+). The control switch 136 is connected between the source-current source 120 and the negative-phase output terminal (OUT-) and the control switch 137 is connected between the sink-current source 132 and the negative-phase output terminal (OUT-). The control switches 134 and 137 receive the up signal UP from the phase comparator 103 and the control switches 135 and 136 receive the down signal DOWN from the phase comparator 103.

As described above, the up signal UP and the down signal DOWN represent the phase error information detected by the phase comparator 103. Normally, the up signal UP and the down signal DOWN do not become active at the same time. While the up signal UP is active, the control switch 134 is switched on and the source current from the source-current source 130 is supplied to the resistor element 162, which functions as load. In addition, the control switch 137 is switched on and the sink current flows from the resistor element 162, which functions as load, to the sink-current source 132. At this time, the current flows through the resistor element 162 in the direction from the node ND101 to the node ND102. While the down signal DOWN is active, the control switch 136 is switched on and the source current from the source-current source 130 is supplied to the resistor element 162, which functions as load. In addition, the control switch 135 is switched on and the sink current flows from the resistor element 162, which functions as load, to the sink-current source 132. At this time, the current flows through the resistor element 162 in the direction from the node ND102 to the node ND101.

Thus, the differential-output charge pump circuit DOCP outputs or receives a pulsed drive current (charge-pump current) corresponding to the phase error information detected by the phase comparator 103 to/from the resistor element 162. At this time, if the amount of the source current I_130 generated by the source-current source 130 and the amount of the sink current I_132 generated by the sink-current source 132 are equal to each other, the current is consumed only by the resistor element 162 and is not used to charge the capacitor element 164 irrespective of whether the up signal UP or the down signal DOWN is active and irrespective of the pulse width of the active signal. Assuming that the amount of the source current I_130 and the amount of the sink current I_132 are both equal to I_R, that the active period width of the up signal UP and the down signal DOWN is Δt, and that the resistance of the resistor element 162 is R_162, the voltage Vr at the ends of the resistor element 162 can be calculated as I_R×Δt×R_162. The voltage Vr at the ends of the resistor element 162 can be adjusted by controlling the active period width Δt of the up signal UP or the down signal DOWN. The direction in which the current flows through the resistor element 162 switches depending on whether the up signal UP is active or the down signal DOWN is active. Therefore, the voltage Vr with which the oscillating unit 101 can be controlled such that the phase thereof is maintained constant can be generated at the resistor element 162 only by the differential-output charge pump circuit DOCP.

The voltage Vr at the ends of the resistor element 162 is added to the voltage Vc at the node ND102, and is supplied to the oscillating unit 101 as a loop filter voltage Vloop. The voltage Vr and the voltage Vc are both controlled on the basis of the up/down signal UP/DOWN which represents the phase error information. Therefore, the output frequency of the oscillating unit 101 is controlled so as to eliminate the phase error information. Thus, the basic operation as the phase-locked loop circuit is similar to that of a common structure.
Loop Characteristics of Phase-Locked Loop Unit; Embodiment The loop characteristics of the phase-locked loop unit 100A according to the present embodiment will now be described in more detail. A linearized closed-loop transfer function, which is generally used for the analysis of a so-called charge-pump PLL, may be used to analyze the operation of the phase-locked loop unit 100.

In the phase-locked loop unit 100A of the present embodiment, when Kosci is the input/oscillation-frequency conversion gain of the oscillating unit 101, R is the resistance (resistance R_162 of the resistor element 162), C is the capacitance (capacitance C_164 of the capacitor element 164), Kcpr is a CPR circuit gain, and Kcpc is a CPC circuit gain, the natural frequency ωn and the damping factor ζ may be expressed as Equations (3-1) and (3-2) (Expression (3)). Here, the CPR circuit gain Kcpr is the circuit gain of the first loop-filter driver 104_1 including the differential-output charge pump circuit DOCP, and the CPC circuit gain Kcpc is the circuit gain of the second loop-filter driver 104_2 including the single-end charge pump circuit SECP.

$$\left. \begin{array}{l} \omega_n = \sqrt{\dfrac{K_{CPC} K_{VCO}}{C}} \quad (3\text{-}1) \\ \zeta = \dfrac{RC}{2} \dfrac{K_{CPR}}{K_{CPC}} \omega_n \quad (3\text{-}2) \end{array} \right\} \quad (3)$$

When, for example, the phase-locked loop unit 100A is used in the read/write apparatus 1, the natural frequency ωn expressed as Equation (3-1) is set to a value determined by the standards for the three types of optical disks PD, that is, the next generation DVD, normal DVD, and CD, by the following method. That is, in the case where the phase-locked loop unit 100A is formed as an IC, the resistance R and the capacitance C are fixed. Therefore, the charge-pump current Icp, the division ratio a of the frequency divider 102, or the input/oscillation-frequency conversion gain Kosci are adjusted.

As is clear from Expression (3), according to the present embodiment, the natural frequency ωn and the damping factor ζ can be varied by changing the CPC circuit gain Kcpc and the CPR circuit gain Kcpr even when the capacitance C and the resistance R are constant. Thus, a high-performance PLL circuit in which the natural frequency ωn and the damping factor ζ can be varied is obtained. In the basic structure of the present embodiment, the resistor element 162 is driven by the differential-output charge pump circuit DOCP. Therefore, control equations used when the gains Kcpc and Kcpr of the two charge pump circuits are changed to adjust the natural frequency ωn and the damping factor ζ are simple.

Since the single-end pulse output circuit (single-end charge pump circuit SECP) and the differential pulse output circuit (differential-output charge pump circuit DOCP) are used in combination, a high-performance PLL circuit in which the natural frequency ωn and the damping factor ζ can be varied without switching between the resistor circuits or the integrating circuits (capacitor circuits) can be obtained.

In the structure of the phase-locked loop unit 100A according to the present embodiment, different from the structure of Japanese Unexamined Patent Application Publication No. 10-84279, the addition of the outputs of the two charge pumps DOCP and SECP is performed on the basis of voltage instead of current, and the loop filter voltage Vloop is obtained as a result of the addition. Therefore, the input to the oscillating unit 101 is a voltage, and the voltage controlled oscillator circuit 101A is preferably used as the oscillating unit 101 instead of the current controlled oscillator circuit 101B, as described above.

In the case where the voltage controlled oscillator circuit 101A is used, the circuit structure is simple. In addition, the voltage-current converter (transconductance) with the voltage-current conversion gain Gm can be omitted, and therefore the influence of the conversion characteristics of the voltage-current converter can be eliminated. When, for example, a ring oscillator is used, a substantially linear relationship can be obtained between the voltage and the oscillation frequency, and additional analog circuits, such as a Gm circuit and a current squared circuit, for current-voltage conversion can be omitted. Since the above-mentioned circuits can be omitted, the noise thereof is not applied to the phase-locked loop unit 100A, and a high-accuracy output can be obtained from the phase-locked loop circuit. In addition, the design process for the above-mentioned additional analog circuits can be omitted and it is not necessary to provide chip areas for arranging the additional analog circuits.

Current Bias Unit

Figure 6:
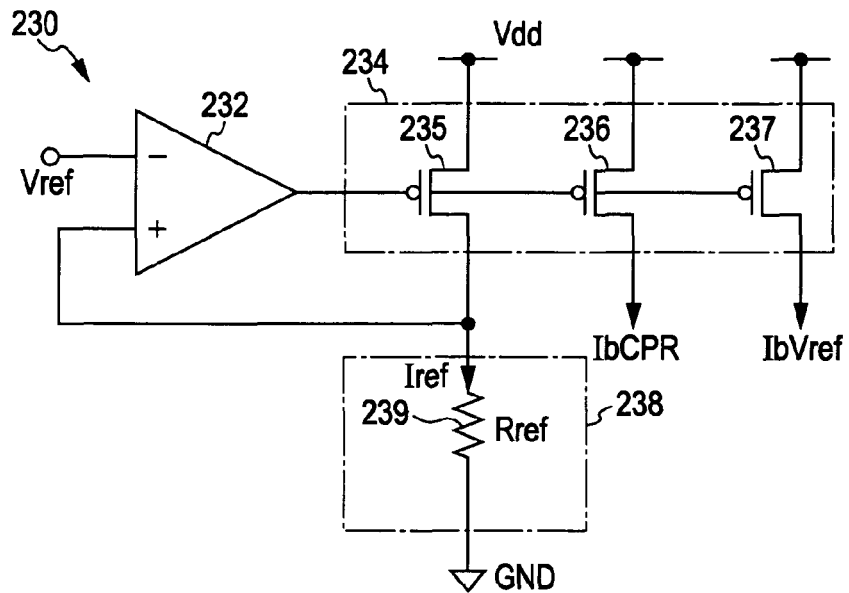
FIG. 6 is a diagram illustrating an example of the structure of a current bias unit.

FIG. 6 is a diagram illustrating an example of the structure of the bias current generator 230. The bias current generator 230 includes a differential amplifier 232 constituted by an operational amplifier (OpAmp) or the like, a current mirror unit 234, and a reference resistor unit 238. The reference voltage Vref from the reference potential generator 220 is supplied to an inverting input terminal (−) of the differential amplifier 232. The reference resistor unit 238 includes a reference resistor 239 having a resistance Rref.

The current mirror unit 234 includes three p-channel current-source transistors 235, 236, and 237 which are connected to a transistor (not shown) at the output stage of the differential amplifier 232 by current mirror connection. Gates of the current-source transistors 235, 236, and 237 are connected to the output of the differential amplifier 232, and sources thereof are connected to a positive source. A drain of the current-source transistor 235 is connected to a non-inverting input terminal (+) of the differential amplifier 232, and the reference resistor 239 is disposed between the drain of the current-source transistor 235 and a reference potential (ground).

The bias current generator 230 receives the reference voltage Vref from the reference potential generator 220 and sets the voltage at the top end of the reference resistor 239 to the reference voltage Vref using a virtual short in the differential amplifier 232, thereby generating a reference current Iref determined as Vref/Rref. Then, the bias current IbCP having a suitable current value for the first loop-filter driver 104_1 is obtained by mirroring the reference current Iref at the current-source transistor 236 that is connected by current mirror connection. Similarly, the bias current IbVref having a suitable current value for the reference voltage generator 240 is obtained by mirroring the reference current Iref at the current-source transistor 237 that is connected by current mirror connection. The bias current IbCPR is used to drive the resistor circuit (resistor element 162), and the bias current IbVref is used in the oscillation gain correction process.

Reference Voltage Generator

Figure 7A:
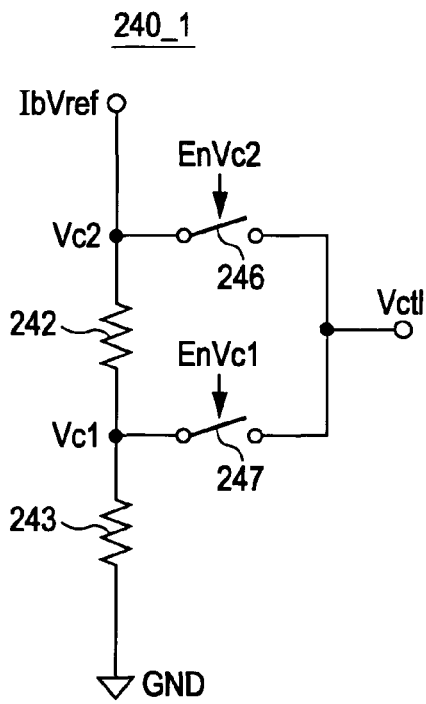
FIGS. 7A and 7B illustrate examples of the structures of reference-voltage generators.
Figure 7B:
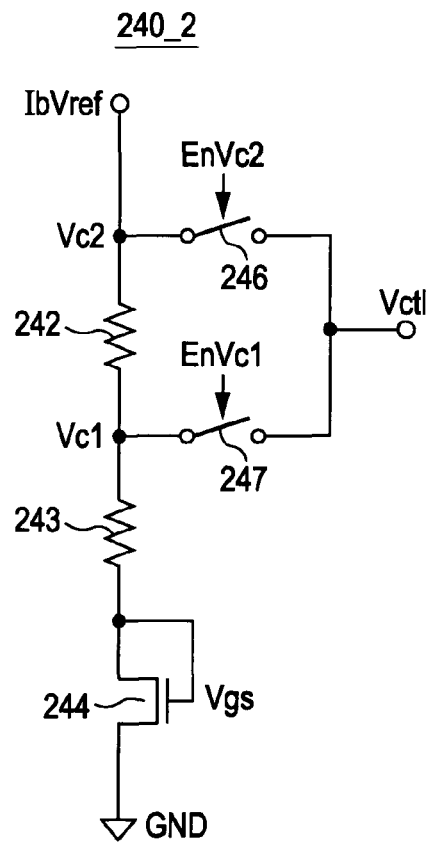

FIGS. 7A and 7B are diagrams illustrating examples of the structure of the reference voltage generator 240. FIG. 7A shows a reference voltage generator 240_1 according to a first example in which the two VCO control voltages Vc1 and Vc2 necessary for the gain calibration are set to fixed voltages. FIG. 7B shows a reference voltage generator 240_2 according to a second example in which the two VCO control voltages Vc1 and Vc2 necessary for the gain calibration can be shifted by a predetermined amount.

The reference voltage generator 240_1 according to the first example includes a series circuit of two resistor elements 242 and 243 and two switches 246 and 247. The resistor elements 242 and 243 are matched with the reference resistor 239 in the bias current generator 230. Also in this case, the matching between the elements means that the matched elements have at least the same temperature variation characteristics. The simplest method for matching the elements is to form the reference resistor 239 and the resistor elements 242 and 243 on a single chip. Alternatively, resistor elements having the same temperature characteristics may, of course, be provided outside a chip. It is preferable to avoid using different types of resistor elements, such as a carbon resistor and a metal-film resistor, since they have different temperature variation characteristics.

One end of the resistor element 242 is connected to a drain of the current-source transistor 237 in the bias current generator 230 so as to receive the bias current IbVref, and is also connected to a voltage output terminal Vctl with the switch 246 provided therebetween. A connection point between the other end of the resistor element 242 and one end of the resistor element 243 is connected to the voltage output terminal Vctl with the switch 247 provided therebetween. The other end of the resistor element 243 is connected to a reference potential (ground).

In the reference voltage generator 240_1 according to the first example, the VCO control voltages Vc1 and Vc2 are generated by supplying the bias current IbVref generated by the bias current generator 230 to the resistor elements 242 and 243, which are matched with the reference resistor unit 238 of the bias current generator 230. Here, it is assumed that R_242 is the resistance of the resistor element 242 and R_243 is the resistance of the resistor element 243. The VCO control voltage Vc1, which is the potential at the contact point between the resistor element 242 and the resistor element 243, can be calculated as IbVref×R_243. The VCO control voltage Vc2, which is the potential at the contact point between the resistor element 242 and the bias current generator 230, can be calculated as IbVref×(R_242+R_243). Since the resistor elements 239, 242, and 243 are matched with each other, even if the absolute values of the resistor elements 239, 242, and 243 are varied due to the process or temperature variation, accurate VCO control voltages Vc1 and Vc2 can be obtained as long as the ratio of the resistances of the resistor elements 242 and 243 are constant.

Figure 8A:
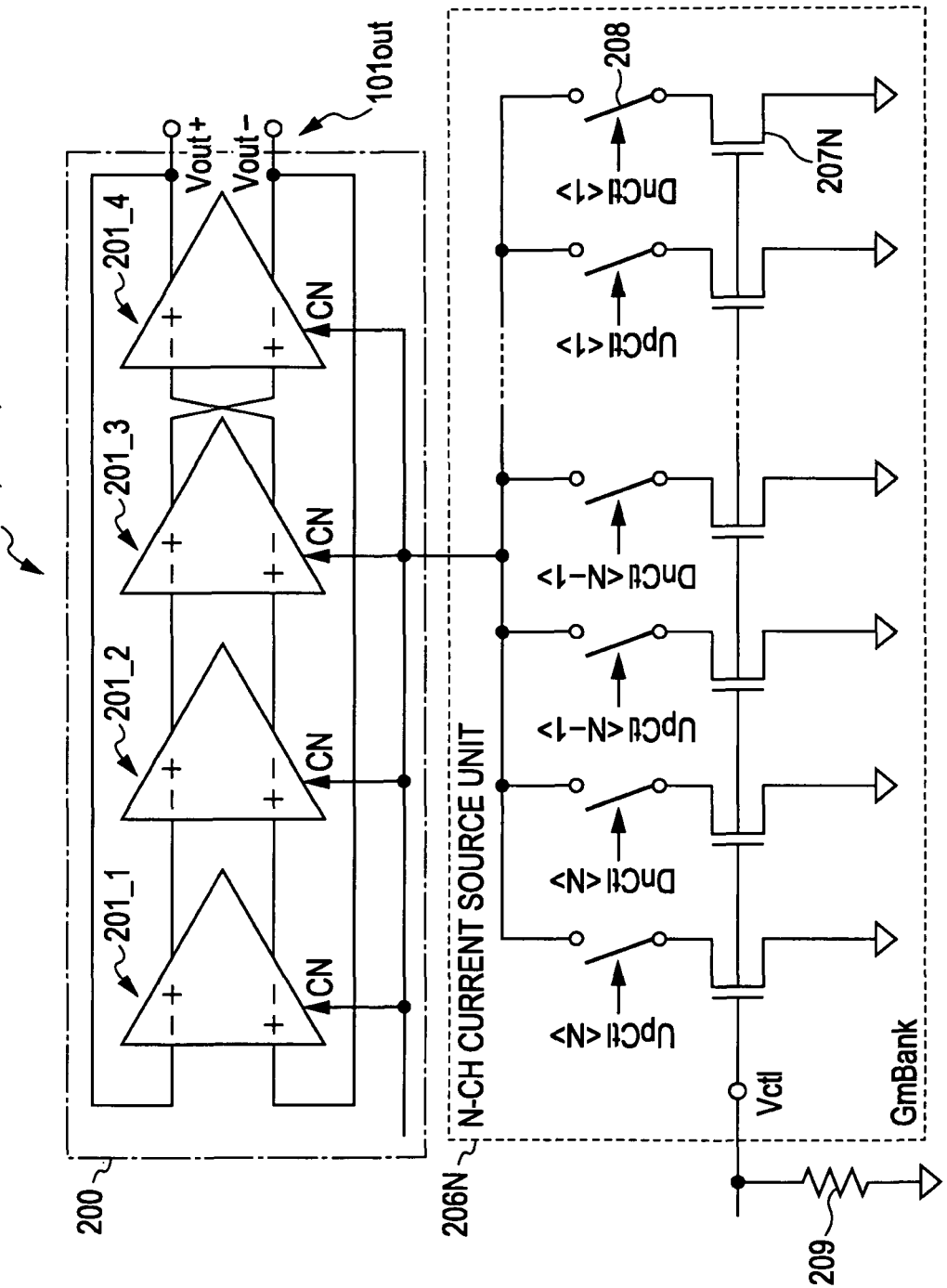
FIGS. 8A and 8B illustrate a voltage controlled oscillator circuit according to a first example.

The basic structure of the reference voltage generator 240_2 according to the second example is similar to that of the reference voltage generator 240_1 according to the first example except a diode-connected n-channel transistor 244 is provided between the resistor element 243 and the reference potential. The reference voltage generator 240_2 according to the second example is capable of shifting the VCO control voltages Vc1 and Vc2 by a gate-source voltage Vgs of the transistor 244. When, for example, the voltage controlled oscillator circuit 101A shown in FIG. 8A is used as the oscillating unit 101, there is a possibility that a threshold voltage Vth of a transistor connected to the frequency control input terminal 101Ain to which the frequency control voltage Vctl is supplied will vary in accordance with the process or temperature variation. In such a case, the VCO control voltages Vc1 and Vc2 can be shifted in accordance with the variation in the threshold voltage Vth. Accordingly, calibration of Kvco can be performed with high accuracy.

Voltage Controlled Oscillator Circuit; First Example

Figure 8B:
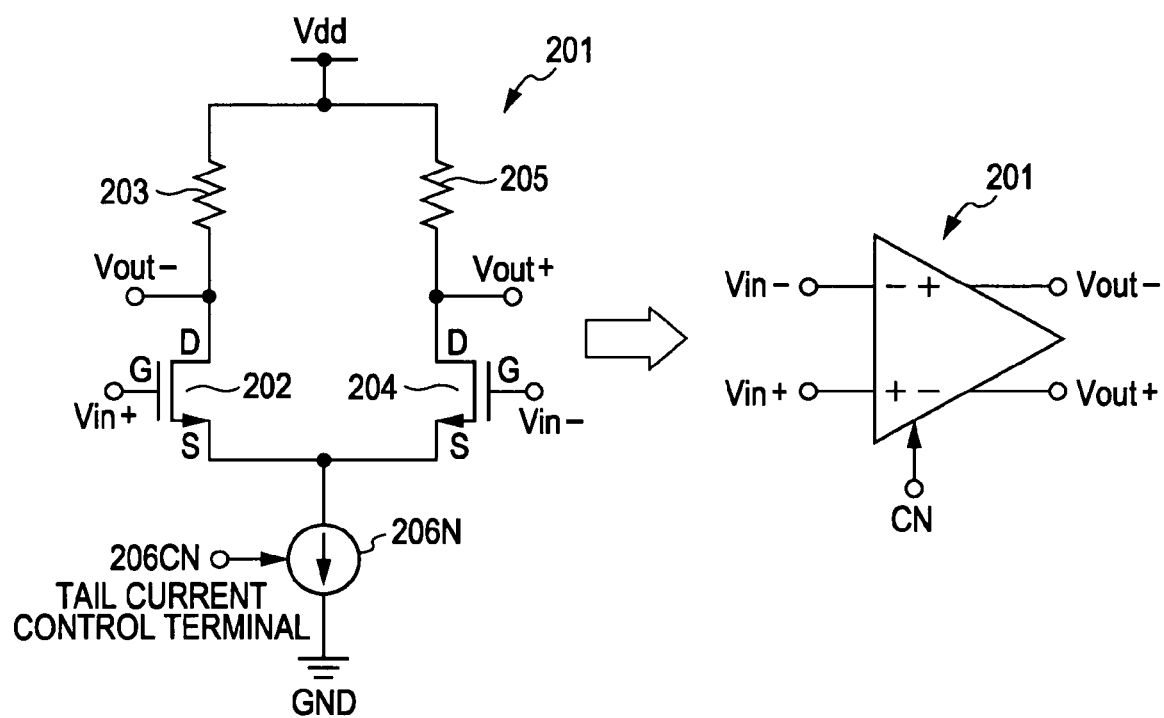

FIGS. 8A and 8B are diagrams illustrating a first example of a voltage controlled oscillator circuit 101A included in the phase-locked loop unit 100. As shown in FIG. 8A, a voltage controlled oscillator circuit 101A_1 according to the first example includes a ring oscillator core circuit 200 disposed between a frequency control input terminal 101in (101Ain) and an output terminal 101Aout. The ring oscillator core circuit 200 includes a predetermined number of delay cells 201 (also referred to as delay stages). In this example, four delay cells 201 are provided. In addition, the voltage controlled oscillator circuit 101A_1 also includes N-ch current source unit 206N (GmBank: current correction unit) used in common by all of the delay cells 201. The N-ch current source unit 206N includes n-channel current source transistors 207N at which current values are weighted in accordance with bits and control switches 208.

The N-ch current source unit 206N supplies an oscillation source current (oscillation bias current) for oscillating each of the delay cells 201 in the ring oscillator core circuit 200. The N-ch current source unit 206N is capable of changing the total oscillation source current in accordance with the frequency control voltage Vctl input thereto. The ring oscillator core circuit 200 is a current controlled oscillator circuit which oscillates at a frequency corresponding to the magnitude of the oscillation source current.

A resistor element 209 for current-voltage conversion may be connected to an input terminal of the N-ch current source unit 206N at which the frequency control voltage Vctl is input. In such a case, the circuit including the resistor element 209 and the voltage controlled oscillator circuit 101A_1 may be handled as the current controlled oscillator circuit 101B for convenience. In view of this, it is preferable not to place the voltage-current converter 166 in the interface between the loop filter unit 106 and the oscillating unit 101.

The voltage controlled oscillator circuit 101A is connected in a negative feedback configuration so that the overall structure forms a differential ring oscillator. In an operating state, the voltage controlled oscillator circuit 101A operates in a positive feedback mode due to the phase shift caused by the inner RC. For example, the delay cells 201 are connected in cascade, and an output signal from the delay cell 201_4 at the last stage is input to the delay cell 201_1 at the first stage.

In this example, the non-inverting output (+) of the delay cell 201_1 at the first stage is connected to the inverting input (−) of the delay cell 201_2 at the second stage, and the inverting output (−) of the delay cell 201_1 at the first stage is connected to the non-inverting input (+) of the delay cell 201_2 at the second stage. In addition, the non-inverting output (+) of the delay cell 201_2 at the second stage is connected to the inverting input (−) of the delay cell 201_3 at the third stage, and the inverting output (−) of the delay cell 201_2 at the second stage is connected to the non-inverting input (+) of the delay cell 201_3 at the third stage.

In contrast, the non-inverting output (+) of the delay cell 201_3 at the third stage is connected to the non-inverting input (+) of the delay cell 201_4 at the fourth stage, and the inverting output (−) of the delay cell 201_3 at the third stage is connected to the inverting input (−) of the delay cell 201_4 at the fourth stage. Therefore, to obtain a positive feedback configuration as a whole, the non-inverting output (+) of the delay cell 201_4 at the fourth stage is connected to the inverting input (−) of the delay cell 201_1 at the first stage, and the inverting output (−) of the delay cell 201_4 at the fourth stage is connected to the non-inverting input (+) of the delay cell 201_1 at the first stage.

One of the two output terminals 101out (the non-inverting input (+) and the inverting input (−) of the delay cell 201_4 at the fourth stage) of the oscillating unit 101 is used as the output terminal 101Aout of the voltage controlled oscillator circuit 101A.

As shown in FIG. 8B, each of the delay cells 201 includes a differential circuit including two transistors 202 and 204 (field-effect transistors in this example). A gate G of one transistor 202 is used as a non-inverting input (Vin+), and a drain D of the transistor 202 is connected to a positive source Vdd through a resistor element 203 and is used as an inverting output (Vout−). A gate G of the other transistor 204 is used as an inverting input (Vin−), and a drain D of the transistor 204 is connected to the positive source Vdd through a resistor element 205 and is used as a non-inverting output (Vout+). The transistors 202 and 204 are arranged to have a common source S, and the common source S is connected to a reference potential (ground potential GND in this example) through the current-variable N-ch current source unit 206N.

The current-variable N-ch current source unit 206N receives an oscillation control signal CN supplied to a control input terminal 206CN (frequency control input terminal 101Ain) in a current mirror mode (current mirror ratio may be 1:1), and supplies the bias current to the transistors 202 and 204.

The N-ch current source unit 206N includes the current source transistors 207N which serve as N sink-current sources corresponding to the bits and the control switches 208 for selectively combining the outputs of the current source transistors 207N. A single current source transistor 207N for up (Up) control and a single current source transistor 207N for down (Dn) control are provided for each bit. Similarly, a single control switch 208 for up (Up) control and a single control switch 208 for down (Dn) control are provided for each bit. The control switches 208Up are turned on or off by an up control signal UpCtl<*>, and control switches 208Dn are turned on or off by a down control signal DnCtl<*>. Here, <*> shows the position of the bits. The up control signal UpCtl<*> and the down control signal DnCtl<*> are supplied from the determination processor 250.

The amounts of current at the current source transistors 207NUp and 207NDn for the up (Up) control and the down (Dn) control, respectively, are set to an equal amount which corresponds to the bit weight. Assuming that the amount of current obtained when the control switches 208Up and 208Dn for all of the bits are turned on is I, the amount of current obtained when only the control switches 208Up for the up control for all of the bits are turned on and the amount of current obtained when only the control switches 208Dn for the down control for all of the bits are turned on are set to I/2.

When a gain calibration process, which will be described below, of the voltage controlled oscillator circuit 101A is started, the determination processor 250 turns on only the control switches 208Dn for the down control for all of the bits so that the amount of current supplied to the ring oscillator core circuit 200 is I/2. The determination processor 250 determines an input-signal/oscillation-frequency conversion gain characteristic (VCO circuit gain Kvcoc) in actual operation on the basis of a difference between actual oscillation frequencies (frequency in actual operation) for the two VCO control voltages Vc1 and Vc2. Then, the determination processor 250 performs the operation of turning on or off the control switches 208Up and 208Dn for the Nth bit in accordance with the magnitude relationship between the oscillation gain Koscic in actual operation and a target oscillation gain Koscit such that the difference between the input-signal/oscillation-frequency conversion gain characteristic (VCO circuit gain Kvcoc) in actual operation and a target input-signal/oscillation-frequency conversion gain characteristic (VCO circuit gain Kvcot) can be eliminated. This process is called a gain determination-and-correction process for the $N^{th}$ bit. While the switching state after the gain determination-and-correction process for the $N^{th}$ bit is maintained, a similar gain determination-and-correction process is successively performed for the $(N-1)^{th}$ bit to the first bit. Thus, the determination-and-correction process is repeated for the N bits. As a result, the VCO circuit gain Kvco for the voltage controlled oscillator circuit 101A is calibrated. This will be described in detail below.

Voltage Controlled Oscillator Circuit; Second Example

Figure 9A:
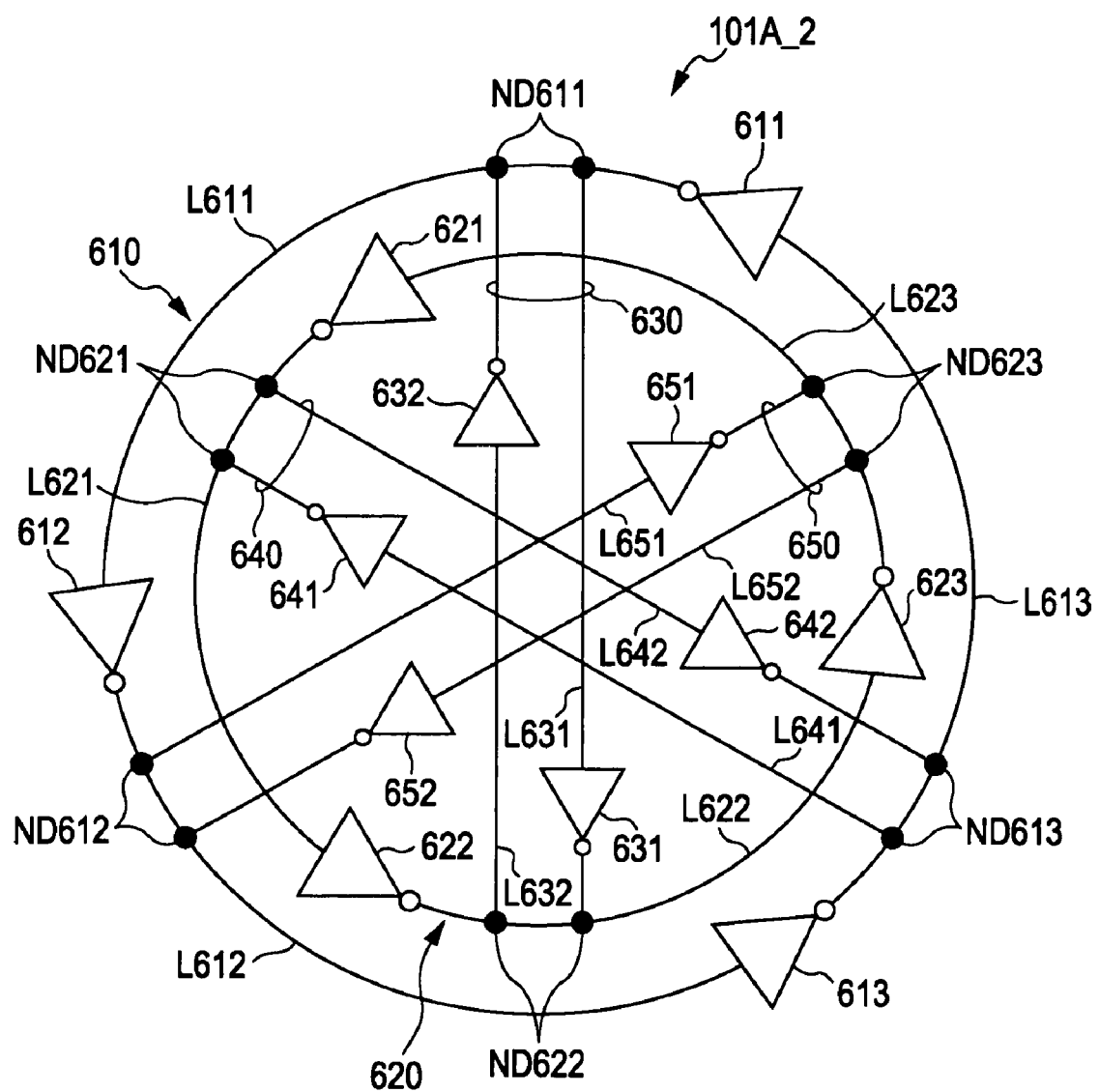
FIGS. 9A to 9D illustrate a voltage controlled oscillator circuit according to a second example.
Figure 9B:
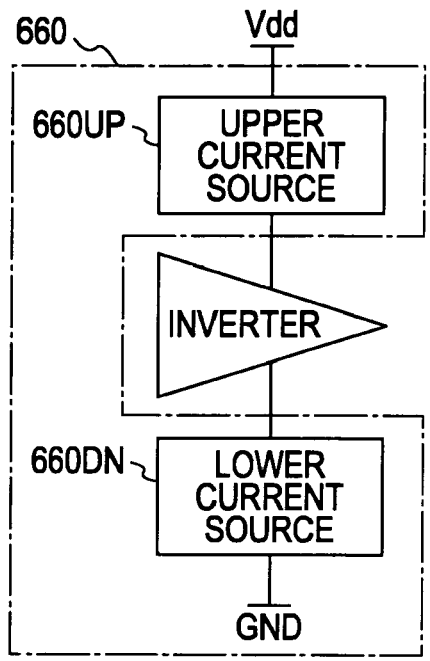
Figure 9C:
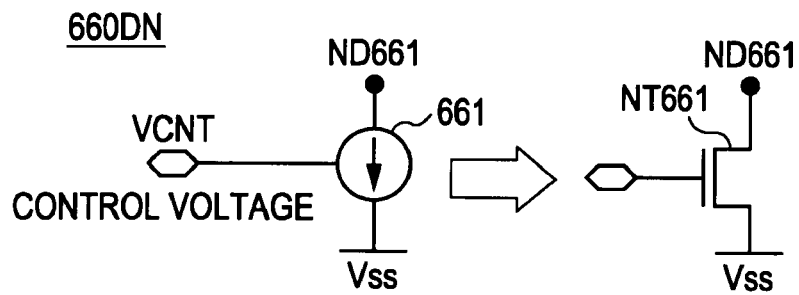
Figure 9D:
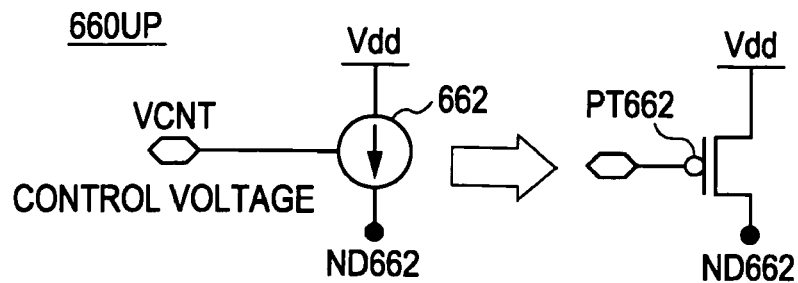
Figure 9E:
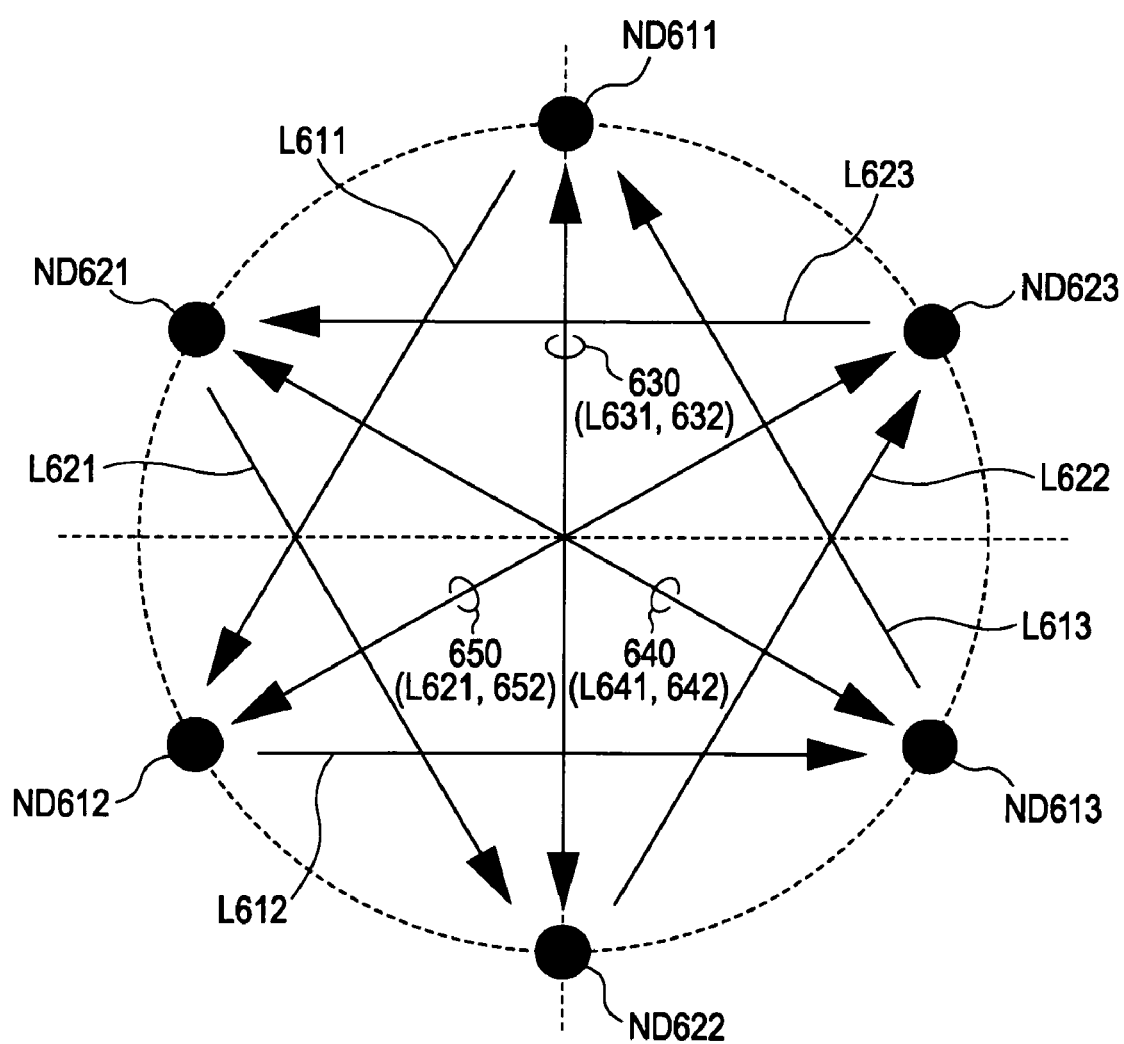
FIG. 9E illustrates the operation of the voltage controlled oscillator circuit according to the second example.
Figure 9F:
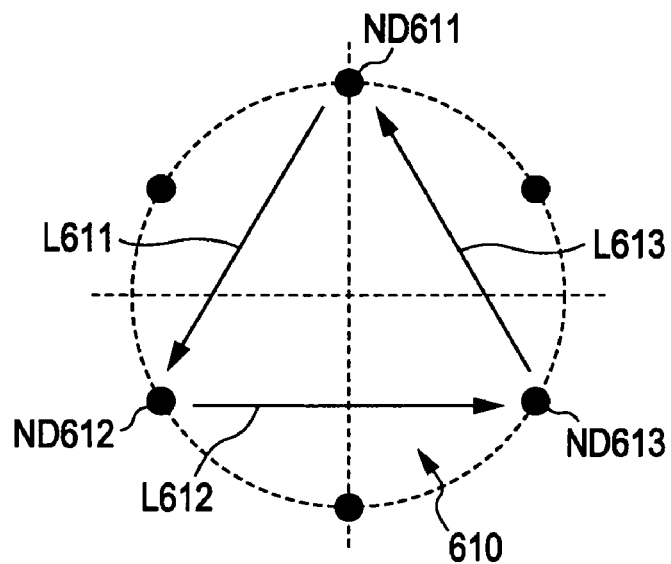
FIGS. 9F to 9H also illustrate the operation of the voltage controlled oscillator circuit according to the second example.
Figure 9G:
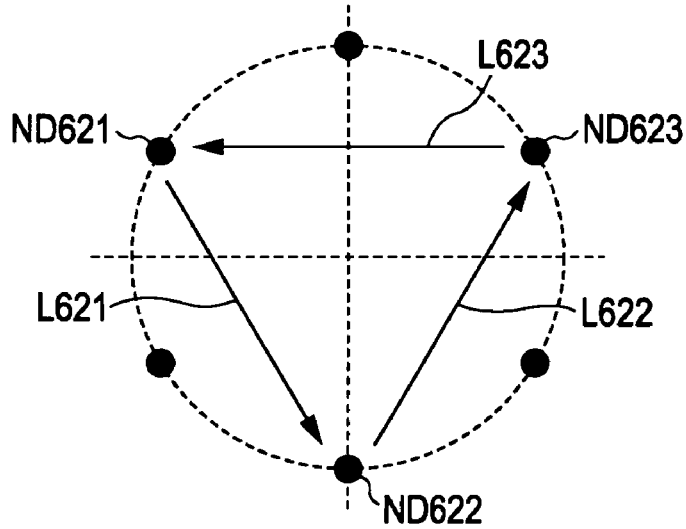
Figure 9H:
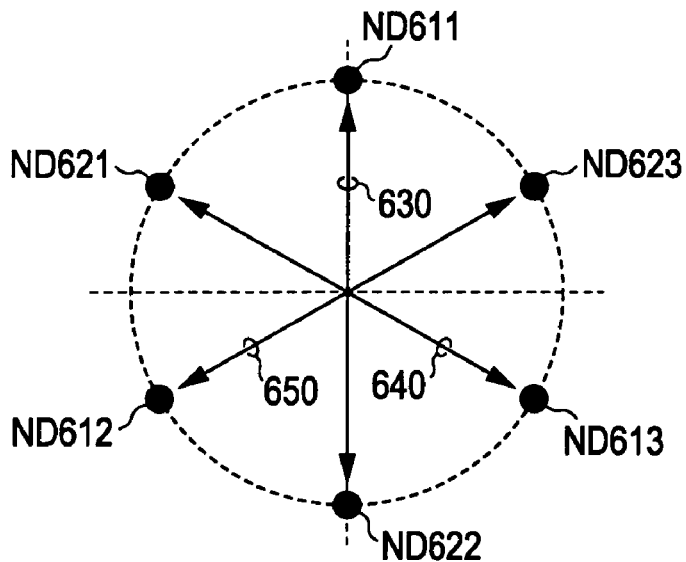
Figure 9I:
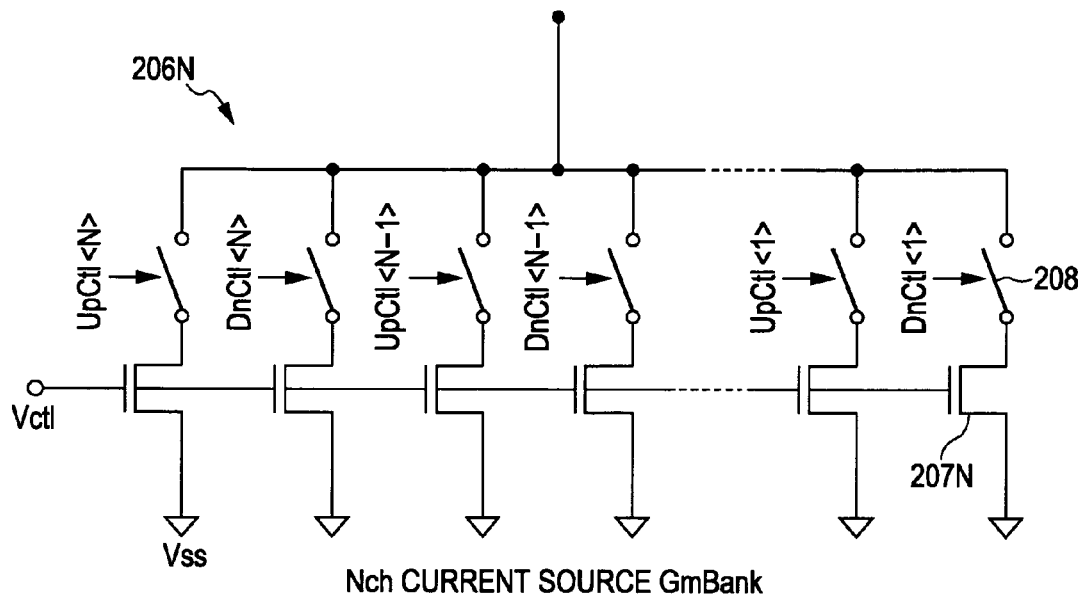
FIGS. 9I and 9J illustrate examples of the structures of current correction units (GmBank) suitable for use in the voltage controlled oscillator circuit according to the second example.
Figure 9J:
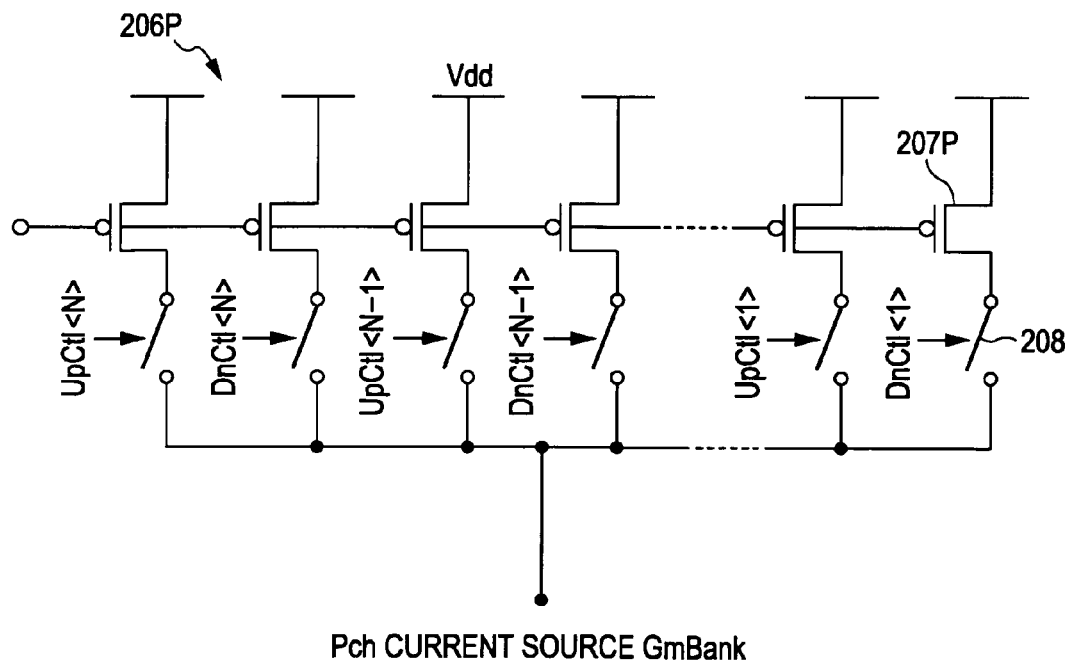

FIGS. 9A to 9J are diagrams illustrating a second example of a voltage controlled oscillator circuit 101A included in the phase-locked loop unit 100. FIGS. 9A to 9D are diagrams illustrating the circuit structure a voltage controlled oscillator circuit 101A_2 according to the second example. FIGS. 9E to 9H are diagrams illustrating the operation of the voltage controlled oscillator circuit 101A_2 according to the second example. FIGS. 9I and 9J illustrate an example of the structure of a current correction unit (GmBank) suitable for use in the voltage controlled oscillator circuit 101A_2 according to the second example.

The voltage controlled oscillator circuit 101A_2 according to the second example is basically formed as a ring VCO circuit having advantages of both the single-end structure and the differential structure. The voltage controlled oscillator circuit 101A_2 according to the second example includes an oscillation core and a control current source 660 as main components. The oscillation core includes an even number of three-stage inverter rings (two three-stage inverter rings 610 and 620 are provided in the example shown in FIG. 9A) and first, second, and third pairs of inverters 630, 640, and 650 connected between the corresponding nodes of the three-stage inverter rings 610 and 620. The first, second, and third pairs of inverters 630, 640, and 650 combine the inverter rings 610 and 620 together and apply a certain phase relationship therebetween. The first and second three-stage inverter rings 610 and 620 form a main loop, and the pairs of inverters 630, 640, and 650 form an inverter (pair) group which forms a sub-loop.

The first three-stage inverter ring 610 is formed by connecting three inverters 611, 612, and 613 (inverting circuits) in cascade in a ring-like (annular) shape. An output terminal of the inverter 611 is connected to an input terminal of the inverter 612, and the connection point therebetween forms a node ND611. A connecting path between the output terminal of the inverter 611 and the input terminal of the inverter 612 including the node ND611 is defined as a line L611. An output terminal of the inverter 612 is connected to an input terminal of the inverter 613, and the connection point therebetween forms a node ND612. A connecting path between the output terminal of the inverter 612 and the input terminal of the inverter 613 including the node ND612 is defined as a line L612. An output terminal of the inverter 613 is connected to the input terminal of the inverter 611, and the connection point therebetween forms a node ND613. A connecting path between the output terminal of the inverter 616 and the input terminal of the inverter 611 including the node ND613 is defined as a line L613.

The second three-stage inverter ring 620 is formed by connecting three inverters 621, 622, and 623 (inverting circuits) in cascade in a ring-like (annular) shape. An output terminal of the inverter 621 is connected to an input terminal of the inverter 622, and the connection point therebetween forms a node ND621. A connecting path between the output terminal of the inverter 621 and the input terminal of the inverter 622 including the node ND621 is defined as a line L621. An output terminal of the inverter 622 is connected to an input terminal of the inverter 623, and the connection point therebetween forms a node ND622. A connecting path between the output terminal of the inverter 622 and the input terminal of the inverter 623 including the node ND622 is defined as a line L622. An output terminal of the inverter 623 is connected to the input terminal of the inverter 621, and the connection point therebetween forms a node ND623. A connecting path between the output terminal of the inverter 623 and the input terminal of the inverter 621 including the node ND623 is defined as a line L623.

The first pair of inverters 630 includes two inverters 631 and 632. An input terminal of the inverter 631 is connected to the node ND611 of the first three-stage inverter ring 610, and an output terminal of the inverter 631 is connected to the node ND622 of the second three-stage inverter ring 620. A connecting path between the nodes ND611 and ND622 including the inverter 631 is defined as a line L631. An input terminal of the inverter 632 is connected to the node ND622 of the second three-stage inverter ring 620, and an output terminal of the inverter 632 is connected to the node ND611 of the first three-stage inverter ring 610. A connecting path between the nodes ND622 and ND611 including the inverter 632 is defined as a line L632.

The second pair of inverters 640 includes two inverters 641 and 642. An input terminal of the inverter 641 is connected to the node ND613 of the first three-stage inverter ring 610, and an output terminal of the inverter 641 is connected to the node ND621 of the second three-stage inverter ring 620. A connecting path between the nodes ND613 and ND621 including the inverter 641 is defined as a line L641. An input terminal of the inverter 642 is connected to the node ND621 of the second three-stage inverter ring 620, and an output terminal of the inverter 642 is connected to the node ND613 of the first three-stage inverter ring 610. A connecting path between the nodes ND621 and ND613 including the inverter 642 is defined as a line L642. The third pair of inverters 650 includes two inverters and 652. An input terminal of the inverter 651 is connected to the node ND612 of the first three-stage inverter ring 610, and an output terminal of the inverter is connected to the node ND623 of the second three-stage inverter ring 620. A connecting path between the nodes ND612 and ND623 including the inverter 651 is defined as a line L651. An input terminal of the inverter 652 is connected to the node ND623 of the second three-stage inverter ring 620, and an output terminal of the inverter is connected to the node ND613 of the first three-stage inverter ring 610. A connecting path between the nodes ND623 and ND612 including the inverter 652 is defined as a line L652.

Thus, the pairs of inverters 630, 640, and 650 function as a coupling inverter (latch) which combines the three-stage inverter rings 610 and 620 together and apply a certain phase relationship.

The inverters 611 to 613, 621 to 623, 631, 632, 641, 642, 651, and 652, which function as basic units of the voltage controlled oscillator circuit 101A_2, are composed of, for example, common CMOS inverters in which PMOS (p-channel MOS) transistors and NMOS (n-channel MOS) transistors are connected to each other. A source of the NMOS (that is, a negative source input terminal) in each of the inverters 611 to 613, 621 to 623, 631, 632, 641, 642, 651, and 652 is connected to a common node ND661. Alternatively, a source of the PMOS (that is, a positive source input terminal) in each inverter is connected to a common node ND662.

As shown in FIG. 9B, each inverter is connected to a control current source 660 which includes an upper current source 660UP and a lower current source 660DN and which supplies a source current. The upper current source 660UP supplies the oscillation source current to the PMOS, which is disposed at an upper section of the CMOS inverter. The lower current source 660DN supplies the oscillation source current to the NMOS, which is disposed at a lower section of the CMOS inverter. The upper current source 660UP and the lower current source 660DN maintain the sum of the source currents supplied to the inverters through the common nodes ND661 and ND662. The upper current source 660UP and the lower current source 660DN are capable of changing the sum of the source currents in accordance with a control signal VCNT input thereto.

As shown in, for example, FIGS. 9C and 9D, the upper current source 660UP and the lower current source 660DN respectively change the current which flows from the node ND661 to the reference potential Vss and the current which flows from the source potential Vdd to the node ND662 on the basis of the control signal VCNT. In the case where only the lower current source 660DN is used, the sink node ND 661 of the current source is short-circuited to the N-side sources of all of the inverters 611 to 613, 621 to 623, 631, 632, 641, 642, 651, and 652 in the oscillation core. The P-side sources of the inverters in the oscillation core are short-circuited to the source potential Vdd. In the case where only the upper current source 660UP is used, the source node ND 662 of the current source is short-circuited to the P-side sources of all of the inverters 611 to 613, 621 to 623, 631, 632, 641, 642, 651, and 652 in the oscillation core. The N-side sources of the inverters in the oscillation core are short-circuited to the ground.

In the voltage controlled oscillator circuit 101A_2 according to the second example, the frequency of the oscillation circuit is controlled by changing the current at the lower current source 660DN and the upper current source 660UP in accordance with the control signal VCNT. As shown in FIG. 9C, the lower current source 660DN is an N-ch current source 661 which can be formed of an NMOS transistor NT661. In this case, a drain of the NMOS transistor NT661 is connected to the node ND661, a source of the NMOS transistor NT661 is connected to the reference potential Vss, and a gate of the NMOS transistor NT661 is connected to a supply line for the control signal VCNT. As shown in FIG. 9D, the upper current source 660UP is a P-ch current source 662 which can be formed of a PMOS transistor PT662. In this case, a drain of the PMOS transistor PT662 is connected to the node ND662, a source of the PMOS transistor PT662 is connected to the source potential Vdd, and a gate of the PMOS transistor PT662 is connected to a supply line for the control signal VCNT.

It is not necessary to used both the upper current source 660UP and the lower current source 660DN. In the case where only the upper current source 660UP is used, the n-side source node of each of the inverters included in the oscillation core is connected to the reference potential (ground). In the case where only the lower current source 660DN is used, the p-side source node of each of the inverters included in the oscillation core is connected to the source potential Vdd.

FIGS. 9E to 9H show the oscillation core, wherein the inverters are drawn by lines with arrows for simplicity. FIGS. 9F to 9H show the components of the structure shown in FIG. 9E. FIGS. 9F and 9G show the three-stage inverter rings, and FIG. 9H shows a coupling latch (pairs of inverters).

In this example, the three-stage inverter ring 610 is drawn as a triangle having three sides L611, L612, and L613, and the nodes ND611, ND612, and ND613 are drawn as three vertices of the triangle. In addition, the three-stage inverter ring 620 is drawn as a triangle having three sides L621, L622, and L623, and the nodes ND621, ND622, and ND623 are drawn as three vertices of the triangle. As shown in FIG. 9E, the triangles are arranged on a circle with even angular intervals, and the nodes which face each other are connected to each other by the pairs of inverters 630, 640, and 650. Thus, the individual three-stage inverter rings 610 and 620 are linked with each other by the group (pairs) of inverters. FIG. 9E also shows the phase relationship between the nodes. More specifically, FIG. 9E shows that six signals whose phases are shifted from each other by 360/6=60° are output by the oscillation circuit. This also means that three differential signals whose phases are shifted from each other by 60° are output.

The operational characteristics of the voltage controlled oscillator circuit 101A_2 according to the second example will now be described. As shown in FIGS. 9E to 9H, the voltage controlled oscillator circuit 101A_2 according to the second example includes a plurality of three-stage inverter rings and a coupling inverter (latch) which links the three-stage inverter rings. In general, the three-stage inverter rings are extremely high-speed oscillators. Therefore, the voltage controlled oscillator circuit 101A_2 according to the second example is capable of oscillating at a high speed. In addition, due to the coupling inverter (latch), the three-stage inverter rings are synchronized with each other instead of oscillating independently. Thus, six phases which are evenly shifted from each other can be obtained. This also means that three kinds of differential signals can be obtained. In addition, the oscillation core can be formed of inverters which are all symmetrical with respect to the source and the ground. Therefore, the oscillation waveforms have good symmetry, and favorable phase noise and jitter characteristics can be obtained. In addition, since current source control is performed, a high source resistance and a wide frequency variable range can be obtained.

As described above, the voltage controlled oscillator circuit 101A_2 according to the second example includes an even number of three-stage inverter rings (two three-stage inverter rings 610 and 620 are provided in the example shown in FIG. 9A); first, second, and third inverter pairs 630, 640, and 650 which are connected between the corresponding nodes of the three-stage inverter rings 610 and 620 and which combine the inverter rings 610 and 620 together to apply a certain phase relationship therebetween; and the control current source 660 as main components. Thus, a high-speed ring oscillation circuit which has small source voltage sensitivity, a wide frequency variable range, and high jitter and phase noise performance and which generates differential signals with phases which are evenly shifted from each other can be obtained. In addition, a phase-locked loop circuit including such a ring oscillation circuit can be obtained.

The voltage controlled oscillator circuit 101A_2 according to the second example includes the lower current source 660DN (N-ch current source 661) and the upper current source 660UP (P-ch current source 662) as the functional elements for controlling the oscillation frequency. The frequency of the oscillation core unit can be controlled by changing the currents at the upper current source 660UP and the lower current source 660DN in accordance with the frequency control voltage Vctl. Similar to the first example, a current correction unit having the GmBank structure may be used as the lower current source 660DN (N-ch current source 661) or the upper current source 660UP (P-ch current source 662), and the process for calibrating ωn and ζ, which will be described below, can be applied.

For example, as shown in FIG. 9I, an N-ch current source unit 206N similar to that used in the voltage controlled oscillator circuit 10A_1 of the first example may be used as the lower current source 660DN (N-ch current source 661). In addition, as shown in FIG. 9J, a P-ch current source unit 206P obtained by replacing the current source transistors 207N in the N-ch current source unit 206N with pMOS current source transistors 207P may be used as the upper current source 660UP (P-ch current source 662).

Although two examples of the voltage controlled oscillator circuit 101A have been described above, the present invention is not limited to this. For example, in an oscillation circuit described in Japanese Unexamined Patent Application Publication No. 2007-274431 (called low-jitter ring VCO), a current source circuit (current source circuit CS1 show in FIG. 4 of the above-mentioned publication) may be replaced by the N-ch current source unit 206N used in the voltage controlled oscillator circuit 10A_1 according to the first example without changing an oscillation ring circuit section. Also in this case, since the N-ch current source unit 206N is used, the process for calibrating ωn and ζ, which will be described below, can be applied.

Figure 11A:
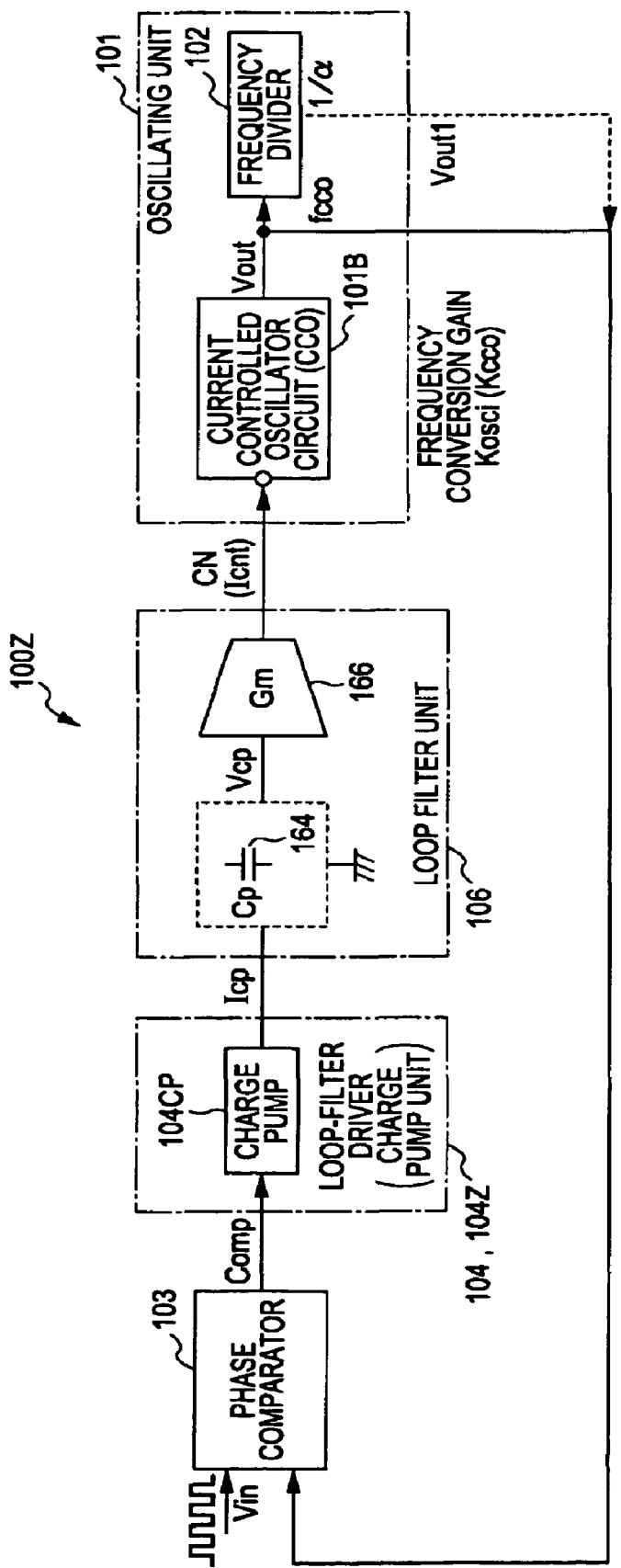
FIG. 11A is a circuit block diagram of a common phase-locked loop circuit.
Figure 11B:
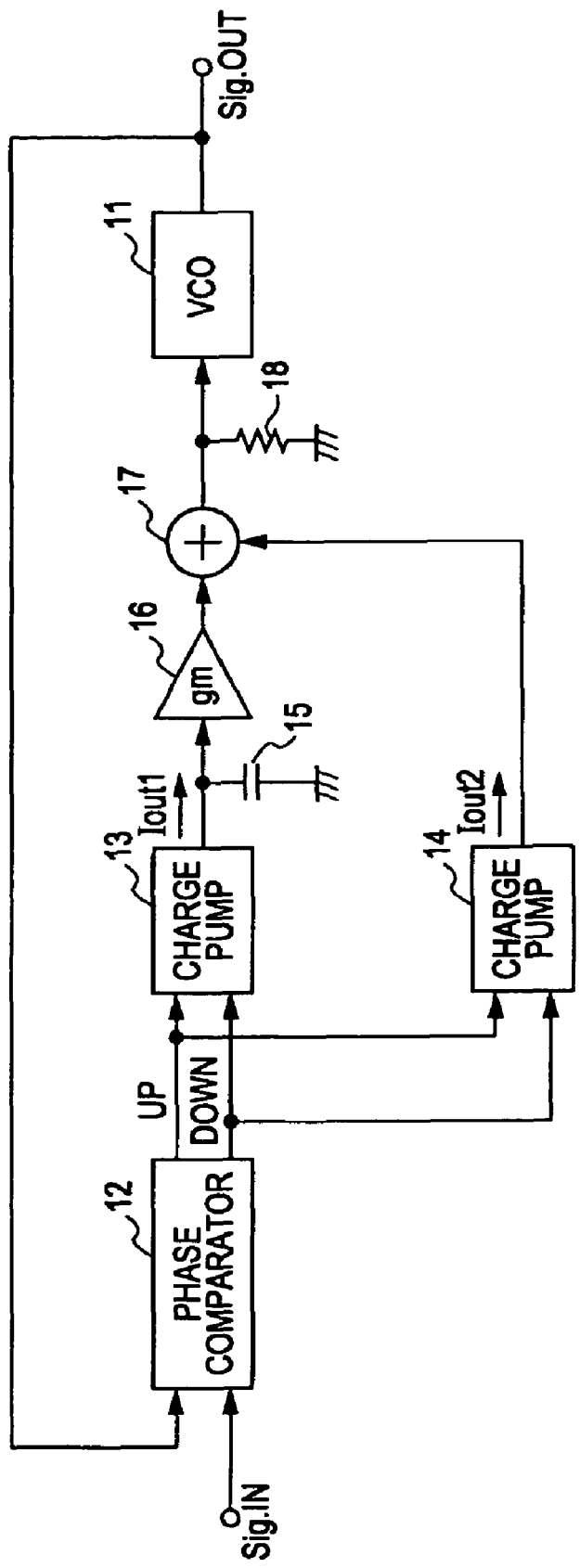
FIG. 11B shows a phase-locked loop circuit disclosed in Patent Document 1.
Figure 11C:
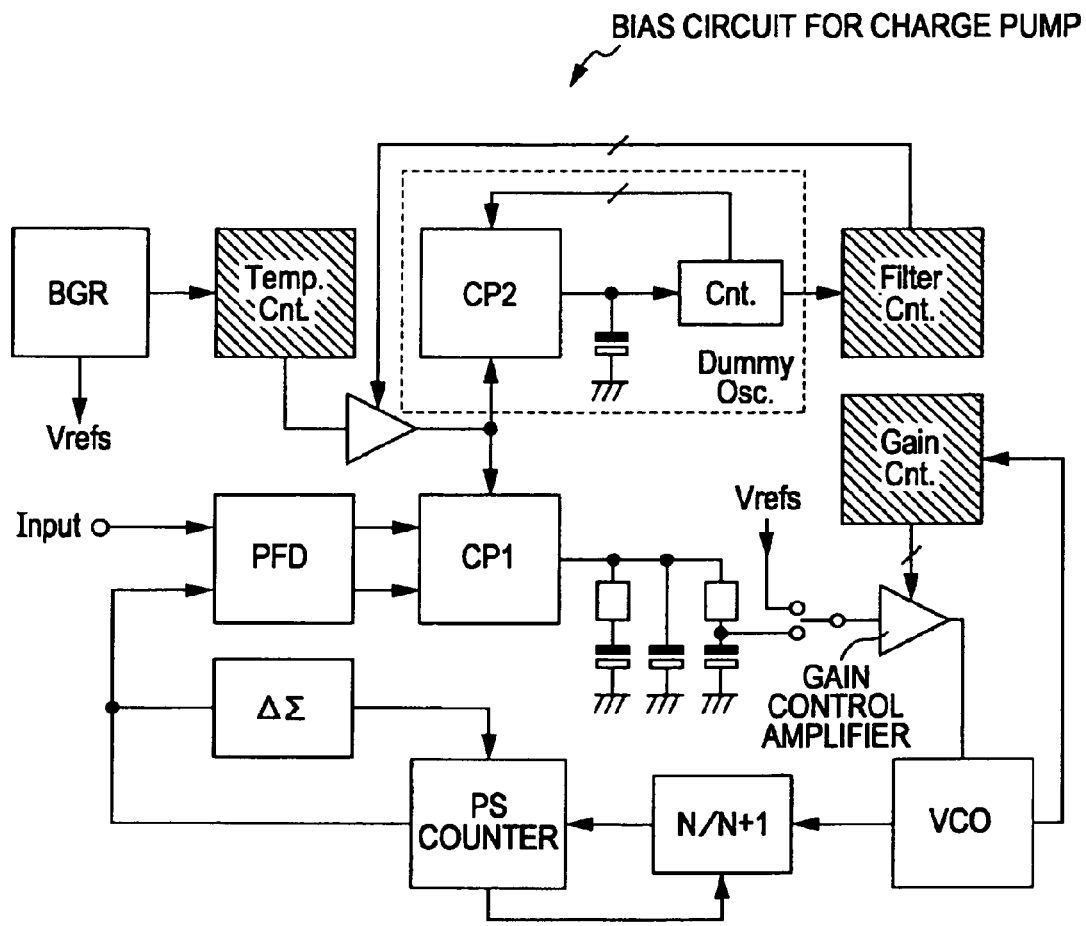
FIG. 11C shows the structure according to Non-Patent Document 1.
Figure 11D:
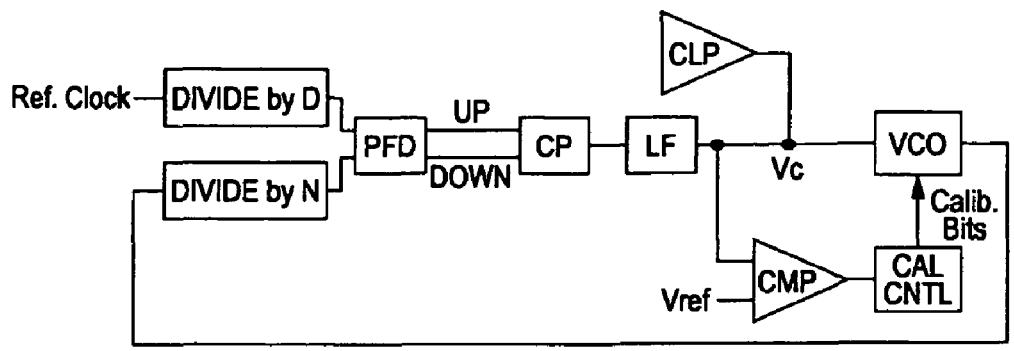
FIGS. 11D and 11E show the structure according to Non-Patent Document 2.
Figure 11E:
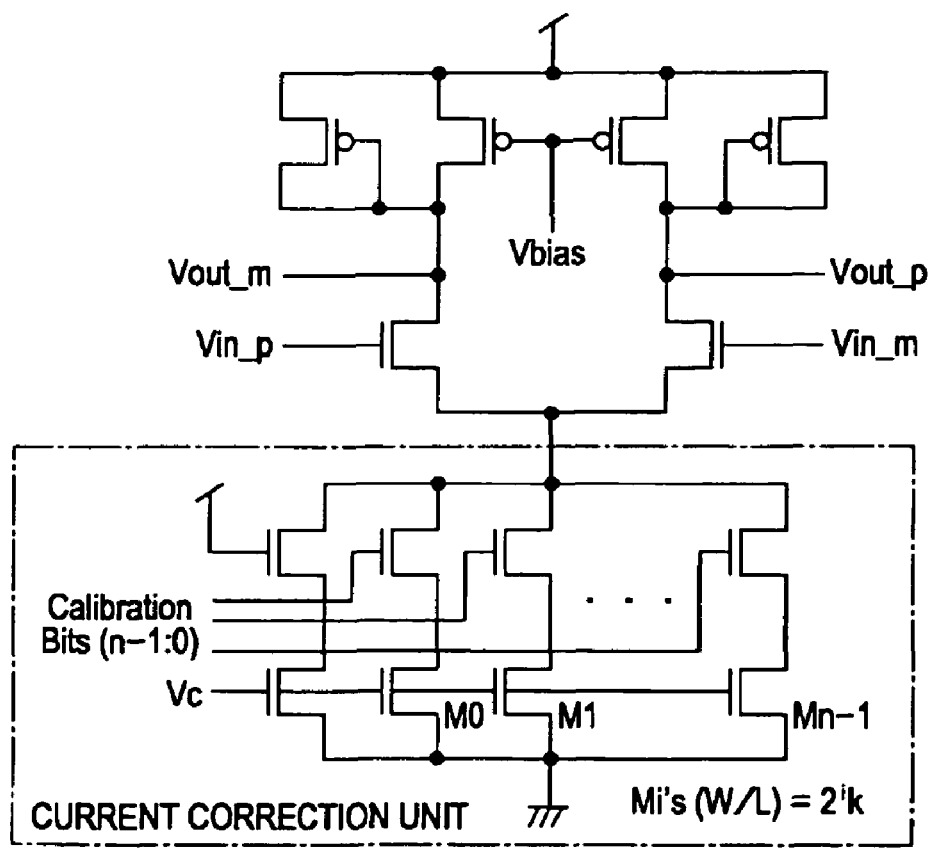

In addition, the N-ch current source unit 206N may also be used in a current correction unit in the structure shown in FIG. 5 of Non-Patent document 2 (see FIG. 11E described below). Also in this case, since the N-ch current source unit 206N is used, the process for calibrating ωn and ζ, which will be described below, can be applied.

Determination Processor

Figure 10A:
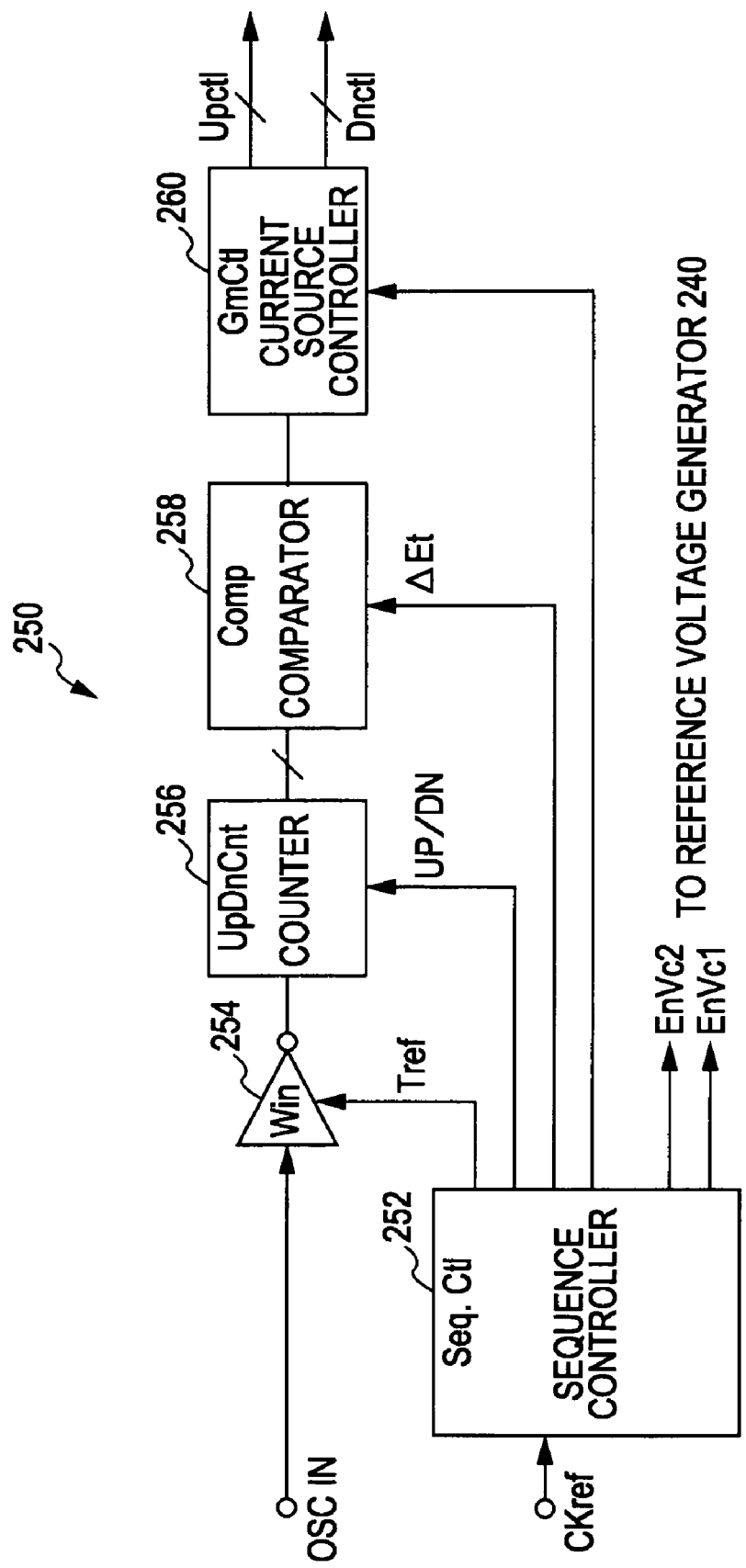
FIG. 10A is a diagram illustrating an example of the structure of a determination processor.

FIG. 10A is a diagram illustrating an example of the structure of the determination processor 250. FIG. 10B is a diagram illustrating the processing procedure performed by the determination processor 250. The determination processor 250 includes a sequence controller 252, a buffer 254, a counter 256, a comparator 258, and a current source controller 260.

The sequence controller 252 controls the sequence of calibration. For example, the sequence controller 252 supplies voltage switching control signals EnVc1 and EnVc2 for causing the reference voltage generator 240 to selectively generate the two VCO control voltages Vc1 and Vc2 to the reference voltage generator 240. The sequence controller 252 also controls the buffer 254, the counter 256, the comparator 258, and the current source controller 260. For example, the sequence controller 252 supplies information regarding a period Tref determined by a reference clock CKref to the buffer 254. The sequence controller 252 supplies a count mode signal UP/DN which shows whether an up-counting operation or a down-counting operation is to be performed by the counter 256 to the counter 256. The sequence controller 252 supplies information regarding a target count value ΔEt, which will be described below, to the comparator 258. The sequence controller 252 issues a command for controlling the down control signal DnCtl<*> or the up control signal UpCtl<*> for each bit on the basis of the result of comparison performed by the comparator 258.

The buffer 254 is a buffer circuit having an enabling function for determining the time for receiving an output oscillation signal Vout with an oscillation frequency fosci generated by the oscillating unit 101. The counter 256 is an up-down counter which counts the output oscillation signal Vout for the period Tref designated by the sequence controller 252. The comparator 258 compares a count value ΔEc obtained by the counter 256 and a target count value ΔEt corresponding to a target oscillation frequency difference Δf.

The current source controller 260 supplies the up control signal UpCtl<*> to the up control switches 208Up in the N-ch current source unit 206N and supplies the down control signal DnCtl<*> to the down control switches 208Dn in the N-ch current source unit 206N on the basis of the result of the comparison performed by the comparator 258.

Calibration of Natural Frequency ωn

Calibration of the natural frequency ωn will now be described. First, before the PLL operation, calibration of the VCO gain Kvco of the oscillating unit 101 (voltage controlled oscillator circuit 101A in this example) is performed.

In this process, the determination processor 250 obtains the input-signal/oscillation-frequency conversion gain characteristic (oscillation gain, that is, VCO circuit gain Kvcoc) of the voltage controlled oscillator circuit 101A on the basis of a difference between the actual oscillation frequencies under the VCO control voltages Vc1 and Vc2 using the two oscillation control signals (VCO control voltages Vc1 and Vc2). Then, the determination processor 250 corrects the operation current for causing the voltage controlled oscillator circuit 101A to oscillate on the basis of the difference between the obtained VCO circuit gain Kvcoc and the target VCO circuit gain Kvcot. In the following description, the measurement using the VCO control voltage Vc2 is performed first, and then the measurement using the VCO control voltage Vc1 is performed. However, the order in which the measurements are performed may be reversed.

First, referring to FIG. 3, the state in which the voltage selector 210 is connected to the reference voltage generator 240 is established using the reference voltage generator 240 and the determination processor 250.

The current source controller 260 in the determination processor 250 sets the up control signal UpCtl<*> to an inactive state for all of the bits and the down control signal DnCtl<*> to an active state for all of the bits. Thus, when the relationship between the current values of the bits in the N-ch current source unit 206N (GmBank) is expressed as shown in FIG. 10B, the up control switches 20BUp in the N-ch current source unit 206N are turned off for all of the bits and the down control switches 208Dn in the N-ch current source unit 206N are turned on for all of the bits, as shown in FIG. 10C.

Then, the determination processor 250 sets the voltage switching control signal EnVc1 to an inactive state and the voltage switching control signal EnVc2 to an active state, so that the VCO control voltage Vc2 is supplied to the N-ch current source unit 206N from the reference voltage generator 240.

In this state, the counter 256 counts up the pulse edges of the output oscillation signal Vout output from the voltage controlled oscillator circuit 101A for the period Tref determined by the reference clock CKref, and stores the count-up value.

Then, the determination processor 250 sets the voltage switching control signal EnVc1 to an active state and the voltage switching control signal EnVc2 to an in active state, so that the VCO control voltage Vc1 is supplied to the N-ch current source unit 206N from the reference voltage generator 240.

In this state, the counter 256 counts down the pulse edges of the output oscillation signal Vout output from the voltage controlled oscillator circuit 101A from the stored count-up value for the period Tref, and stores the count value.

The count value stored by the counter 256 at this time corresponds to a difference in the number of pulse edges (edge number difference) obtained when a potential difference between the VCO control voltages Vc1 and Vc2 is supplied to the voltage controlled oscillator circuit 101A. The difference in the number of pulse edges shows the difference in the oscillation frequency, and directly indicates the VCO circuit gain Kvcoc under the current setting.

The VCO circuit gain Kvcoc under the current setting can be expressed as Equation (4). In Equation (4), Eup is the number of pulse edges in the VCO output in the count-up operation, Edn is the number of pulse edges in the VCO output in the count-down operation, ΔEc is the difference between the numbers of pulse edges Eup and Edn in the VCO outputs, and ΔVc is the difference between the VCO control voltages Vc1 and Vc2 generated by the reference voltage generator 240.

$$K_{VCOC} = \frac{E_{up} - E_{dn}}{V_{C2} - V_{C1}} \frac{1}{T_{ref}} = \frac{\Delta E_C}{\Delta V_C} \frac{1}{T_{ref}} \quad (4)$$

The comparator 258 determines the VCO circuit gain Kvcoc from Equation (4). Then, the comparator 258 compares the VCO circuit gain Kvcoc with the target VCO circuit gain Kvcot. Since the information that can be obtained from the actual circuit is the difference ΔEc in the number of pulse edges in the VCO output, it is necessary to obtain a target count value ΔEt corresponding to the difference in the number of edges based on the VCO circuit gain Kvcot for the comparison. The target count value ΔEt can be expressed as Equation (5).

$$\Delta E_T = K_{VCOT} T_{ref} \Delta V_c \quad (5)$$

The comparator 258 compares ΔEc with ΔEt, and supplies the result of the comparison to the current source controller 260. If ΔEc is greater than ΔEt, the current source controller 260 sets the down control signal DnCtl<*> for the $N^{th}$ bit (MSB) to an inactive state. If ΔEc is equal to or less than ΔEt, the current source controller 260 sets the up control signal UpCtl<*> for the $N^{th}$ bit (MSB) to an active state.

Then, the determination processor 250 performs an operation for the $(N-1)^{th}$ bit while maintaining the states of the down control signal DnCtl<*> and the control signal UpCtl<*> for the $N^{th}$ bit at the current states. Similar to the sequence for the $N^{th}$ bit, the difference ΔEc between the numbers of edges for the VCO control voltages Vc1 and Vc2 is obtained and is compared with the target count value ΔEt. Then, the down control signal DnCtl<*> and the up control signal UpCtl<*> for the $(N-1)^{th}$ bit are similarly controlled on the basis of the result of the comparison. The above-described sequence is repeated N times (which corresponds to the number of bits), and thus the VCO circuit gain Kvco is calibrated.

For example, in a first step in the sequence for the $N^{th}$ bit, ΔEc is measured and is compared with ΔEt in the state shown in FIG. 10C. When ΔEc>ΔEt is satisfied, the $N^{th}$ bit (MSB) is controlled as shown in FIG. 10D. When ΔEc≦ΔEt is satisfied, the $N^{th}$ bit (MSB) is controlled as shown in FIG. 10E. Then, in the next step (second step for the $(N-1)^{th}$ bit), the processes including the process of comparing ΔEc with ΔEt are performed again while the state shown in FIG. 10D or FIG. 10E is maintained. Then, the $(N-1)^{th}$ bit is controlled on the basis of the result of the comparison, and the above-described processes are repeated to LSB. Thus, the sequence of calibration is performed.

In the PLL of a digital data recovery system for reading digital data from a disk medium, it is necessary to follow the variation in data rate caused by eccentricity of the servo mechanism which rotates the disk. However, it is preferable not to follow the variation in data rate due to the noise included in the disk medium. For this reason, it is generally necessary to reduce the natural frequency ωn. Therefore, the CPC circuit gain Kcpc and the VCO circuit gain Kvco are set as small as possible. However, there is a limit to the reduction of the gains. In addition, although the natural frequency ωn can also be reduced by increasing capacitance C of the capacitor element 164, a large chip area is used in such a case. According to the present embodiment, the capacitor element 164 is mounted outside the chip so as to reduce the natural frequency ωn to a certain level. Therefore, a capacitor element having a controlled capacitance C or a capacitance C that can be externally varied may be used. The capacitor element 164 does not cause variation in the natural frequency ωn.

Therefore, variation in the natural frequency ωn can be suppressed by calibrating the VCO circuit gain Kvco, which is the major factor that causes the variation in the natural frequency ωn. In the above-described calibration process according to the present embodiment, the CPC circuit gain Kcpc is not calibrated. However, the capacitor element 164 is provided as an external device disposed outside the circuit (outside the semiconductor chip), and the capacitance C thereof is controllable. In this case, the variation in the VCO circuit gain Kvco is about as ten times as large as that in the CPC circuit gain Kcpc, and it can be assumed that the VCO circuit gain Kvco is the major factor that affects the variation in the constants ωn and ζ in the PLL. Therefore, the constants ωn and ζ can be set close to the design values by calibrating the VCO circuit gain Kvco.

Calibration of Damping Factor ζ

Calibration of the damping factor ζ will now be described. In the phase-locked loop unit 100A shown in FIG. 3, the largest factor that causes the variation in the damping factor ζ is the resistance R of the resistor element 162.

As is clear from Expression (3), independent variables for the natural frequency ωn and the damping factor ζ are the resistance R and the CPR circuit gain Kcpr. The damping factor ζ can be calibrated without changing the natural frequency ωn by cancelling the variation in the resistance R with the CPR circuit gain Kcpr, in other words, with the setting the CPR circuit gain Kcpr such that the CPR circuit gain Kcpr is inverse proportional to the variation of the resistance R.

In the phase-locked loop unit 100A shown in FIG. 3, the resistor element 162 in the loop filter unit 106 is matched with the reference resistor 239 in the bias current generator 230. In general, in the case where two resistor elements are formed on a single chip, variation in the absolute value of the resistance of each resistor element is about ±20%. However, a relative difference between the two resistor elements is extremely small. Therefore, when the resistance R varies, the resistance Rref of the reference resistor 239 also varies in a similar manner.

In the bias current generator 230 shown in FIG. 6, the reference current Iref generated using the resistance Rref and calculated as Vref/Rref is mirrored by the current-source transistor 236 in the current mirror unit 234 to provide the bias current IbCPR for the first loop-filter driver 104_1. As a result, the CPR circuit gain Kcpr is constantly inverse proportional to the variation in resistance Rref of the reference resistor 239.

Therefore, the CPR circuit gain Kcpr is also inverse proportional to the variation in the resistance R of the resistor element 162 (loop filter resistor), and the damping factor ζ can thus be calibrated.

As described above, the phase-locked loop unit 100A according to the present embodiment is capable of calibrating the natural frequency ωn and the damping factor ζ.

In the above-described structure, the PLL main unit includes the two loop-filter drivers 104, which are the single-output loop-filter driver and the differential output loop-filter driver, and the voltage controlled oscillating unit 101A. The voltage controlled oscillating unit 101A includes a combination of the N-ch current source unit 206N having a plurality of current source circuits (current source transistors 207N) and the ring oscillator core circuit 200, which is a current controlled oscillator circuit operated under an oscillating source current (oscillation bias current) from the N-ch current source unit 206N. This provides an effective function in the calibration of ωn and ζ.

In addition, the gain-characteristic-information obtaining unit 107 includes a logic circuit (determination processor 250) which determines the control-signal/frequency characteristic Kosci (VCO circuit gain Kvcoc) on the basis of the output oscillation signal Vout (output clock) from the voltage controlled oscillator circuit 101A and controls the N-ch current source unit 206N such that the desired VCO circuit gain Kvco can be obtained, and the bias current generator 230 which applies the constant voltage (reference voltage Vref) generated by the reference potential generator 220 and the bias current IbCPR generated by the reference resistor 239 to the first loop-filter driver 104_1 which drives the resistor element 162. This also provides an effective function in the calibration of ωn and ζ.

It can be easily understood that the above explanation also applies to the case in which the voltage controlled oscillator circuit 101A is replaced by the current controlled oscillator circuit 101B (for example, the case in which the resistor element 209 for current-voltage conversion is added).

The oscillation gain Kosci performs self-calibration by the calibration method using the PLL main unit and the gain-characteristic-information obtaining unit 107 shown in FIG. 3. Therefore, unlike the comparative example, it is not necessary to feedback the calibration information to circuits, such as the charge pump CP, other than the oscillating unit 101. Therefore, the circuits can be individually designed, and not only the oscillating unit 101 itself but also the other circuits can be easily designed and verified.

In addition, the calibration of the CPR circuit gain Kcpr is performed by fully digital circuits, and the calibration information is provided as digital signals. Therefore, the jitter performance is not degraded and the chip area can be reduced. In addition, the damping factor ζ can be calibrated without changing the natural frequency ωn by using the structure of the PLL main unit shown in FIG. 3. Thus, a high-performance PLL capable of calibrating the variation in the natural frequency ωn and the damping factor ζ due to process and temperature variation can be formed in a small area.

In addition, a structure in which characteristics of the noise performance, the circuit scale, the ease of calibration, and the design and verification processes are balanced is provided.

Although the embodiment of the present invention has been described, the technical scope of the present invention is not limited to the scope of the above-described embodiment. Various modifications and improvements can be made within the gist of the present invention, and such modifications and improvements are included in the technical scope of the present invention.

The above-described embodiment does not limit the claimed invention, and not all of the combinations of the features described in the embodiment are necessary for carrying out the invention. The above-described embodiment includes various stages of the invention, and various forms of the invention can be obtained by suitable combinations of the features described in the embodiment. Even when some of the features described in the embodiment are omitted, the remaining features form the present invention as long as the advantage of the present invention can be obtained.

For example, although the optical disk apparatus is described as the read/write apparatus in the above-described embodiment, the read/write apparatus is not limited to the optical disk apparatus, and may also be, for example, a hard disk driving apparatus. The hard disk driving apparatus also uses a clock recovery circuit and a write clock generator circuit. The phase-locked loop unit 100 according to the above-described embodiment may be used as the clock recovery circuit or the write clock generator circuit.

In addition to the optical disk apparatus or the hard disk driving apparatus, the phase-locked loop unit 100 may also be used in other types of read/write apparatuses, such as a digital VTR and a digital VCR, as a clock recovery circuit for generating a recovery clock on the basis of the phase information of a reproduction signal obtained from a recording medium.

In addition to the read/write apparatus, the present invention may also be applied to, for example, an apparatus for setting a timing of a reception. signal line, such as an input/output interface for a serial communication through a medium such as a twist pair metal cable and a fiber cable or for an inter-chip communication. In addition, the present invention may also applied to other types of electronic apparatuses.

The present application contains subject matter related to that disclosed in Japanese Priority Patent Application JP 2008-197475 filed in the Japan Patent Office on Jul. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A phase-locked loop circuit, comprising:
   a phase detection unit which detects phase information of an input signal;
   a loop filter unit which includes a series circuit of a resistor circuit and a capacitor circuit, a terminal of the capacitor circuit opposite the resistor circuit being connected to a reference point;
   a first pulse-current output unit which supplies a differential pulse current to one of the resistor circuit and the capacitor circuit from a positive-phase output terminal and a negative-phase output terminal, the differential pulse current corresponding to the phase information output from the phase detection unit;
   a second pulse-current output unit which supplies a single-end pulse current to the other one of the resistor circuit and the capacitor circuit from a single output terminal, the single-end pulse current corresponding to the phase information output from the phase detection unit;
   an oscillating unit capable of varying an oscillation frequency in accordance with a component obtained by combining a voltage generated at both ends of the one of the resistor circuit and the capacitor circuit on the basis of the differential pulse current supplied from the positive-phase output terminal and the negative-phase output terminal of the first pulse-current output unit and a voltage generated at both ends of the other one of the resistor circuit and the capacitor circuit on the basis of the single-end pulse current supplied from the single output terminal of the second pulse-current output unit; and
   a calibration unit which obtains information of an oscillation gain in actual operation and corrects an oscillating operation of the oscillating unit on the basis of a difference between the oscillation gain in actual operation and a target oscillation gain, the oscillation gain in actual operation representing a characteristic of oscillation frequency versus input signal of the oscillating unit and being obtained using oscillation control signals for correction with predetermined magnitudes on the basis of a difference between actual oscillation frequencies under the oscillation control signals, wherein the calibration unit includes
- a reference potential generator which generates a reference voltage with a predetermined magnitude;
- a current bias unit which includes a reference resistor having a resistance with a reference magnitude, which generates a reference current with a predetermined magnitude on the basis of the reference voltage generated by the reference potential generator and the reference resistor, and which generates a bias current for correction of the oscillation gain by mirroring the reference current; and
- a correction control signal generator which generates the oscillation control signals for correction on the basis of the bias current for correction generated by the current bias unit, wherein the correction control signal generator includes a series circuit of a resistor element through which the bias current for correction flows and a transistor having a temperature characteristic that matches a temperature characteristic of a transistor included in the oscillating unit, and wherein the reference resistor and the resistor element through which the bias current for correction flows have substantially the same temperature variation characteristic.

* * * * *